US012750991B2

(12) United States Patent
Hector, Jr. et al.

(10) Patent No.: US 12,750,991 B2
(45) Date of Patent: Sep. 29, 2026

(54) EMP PROTECTION FOR STRUCTURES HAVING COAL COMBUSTION RESIDUAL COMPONENTS

(71) Applicant: Go Team CCR, LLC, Raleigh, NC (US)

(72) Inventors: Francis Norbert Hector, Jr., Raleigh, NC (US); Davidson A. Scott, Stafford, VA (US)

(73) Assignee: Go Team CCR, LLC, Raleigh, NC (US)

( * ) Notice: Subject to any disclaimer, the term of this patent is extended or adjusted under 35 U.S.C. 154(b) by 0 days.

(21) Appl. No.: 18/416,475

(22) Filed: Jan. 18, 2024

(65) Prior Publication Data

US 2024/0164074 A1 May 16, 2024

Related U.S. Application Data

(60) Continuation-in-part of application No. 18/048,054, filed on Oct. 20, 2022, now Pat. No. 11,903,176, which is a continuation of application No. 17/693,892, filed on Mar. 14, 2022, now Pat. No. 11,523,549, which is a division of application No. 16/905,406, filed on Jun. 18, 2020, now Pat. No. 11,357,141, which is a continuation-in-part of (Continued)

(51) Int. Cl.
*H05K 9/00* (2006.01)
*E04B 1/38* (2006.01)

(52) U.S. Cl.
CPC .......... *H05K 9/0003* (2013.01); *E04B 1/388* (2023.08)

(58) Field of Classification Search
CPC ... E04B 1/16; E04B 1/388; E04B 2/84; G21F 1/04; E04G 21/106; E04G 21/02; E04G 21/165
USPC .................................................... 52/742.14
See application file for complete search history.

(56) References Cited

U.S. PATENT DOCUMENTS 3,092,218 A * 6/1963 Clay .................... H05K 9/0015
250/517.1
4,936,540 A * 6/1990 Boeshart ............... E04B 2/8647
249/40

(Continued)

*Primary Examiner* — Paola Agudelo
(74) *Attorney, Agent, or Firm* — Shumaker, Loop & Kendrick, LLP; S. Alexander Long, Jr.; Brian D. MacDonald

(57) ABSTRACT

An electromagnetic emission shield for protecting a facility has a volume containing coal combustion residue. The shield includes a carbon-based material positioned inside an interior space of the coal combustion residue proximate to and interposed between a potential source of electromagnetic emission and the facility. A casting arrangement for fabricating a structural panel for use in constructing an EMP-protective composite structure, includes an uninterrupted ferrous back panel having an inner side and an outer side. An edge form of side members is removably positioned around the uninterrupted ferrous back panel defining a perimeter. Studs are welded to the inner side of the uninterrupted ferrous back panel within the perimeter. Reinforcing members define a grid within the perimeter. A cementitious layer is poured on the inner side of the uninterrupted ferrous back panel in which the plurality of studs and the reinforcing members are embedded.

13 Claims, 35 Drawing Sheets

Related U.S. Application Data application No. 16/711,581, filed on Dec. 12, 2019, now Pat. No. 10,765,045.

(60) Provisional application No. 62/883,696, filed on Aug. 7, 2019, provisional application No. 62/863,394, filed on Jun. 19, 2019.

(56) References Cited

U.S. PATENT DOCUMENTS

| | | | | |
|---|---|---|---|---|
| 5,638,652 | A * | 6/1997 | Shinoda | G21C 13/093 52/432 |
| 7,681,368 | B1 * | 3/2010 | Rubio | E04C 2/044 52/309.7 |
| 9,862,118 | B2 * | 1/2018 | Ciuperca | B28B 17/0081 |
| 2013/0074433 | A1 * | 3/2013 | Ciuperca | E04B 1/41 52/698 |
| 2013/0326982 | A1 * | 12/2013 | Jordan | E04C 2/288 52/426 |
| 2014/0087158 | A1 * | 3/2014 | Ciuperca | B32B 3/266 428/223 |
| 2014/0260034 | A1 * | 9/2014 | Ciuperca | E04C 2/26 52/405.3 |
| 2015/0069647 | A1 * | 3/2015 | Ciuperca | C04B 7/02 249/13 |
| 2017/0218614 | A1 * | 8/2017 | Ciuperca | E04G 9/06 |
| 2018/0258659 | A1 * | 9/2018 | LeBlanc | E04B 7/20 |
| 2021/0282303 | A1 * | 9/2021 | Sadler | H05K 9/0003 |

* cited by examiner

EMP PROTECTION FOR STRUCTURES HAVING COAL COMBUSTION RESIDUAL COMPONENTS

CROSS-REFERENCE TO RELATED APPLICATION

This utility patent application is a continuation-in-part (CIP) of, and claims the benefit of priority of, co-pending U.S. patent application Ser. No. 18/048,054, filed on Oct. 20, 2022, which is a continuation U.S. application Ser. No. 17/693,892, filed on Mar. 14, 2022, now U.S. Pat. No. 11,523,549, which is a divisional application of U.S. application Ser. No. 16/905,406 filed on Jun. 18, 2020, now U.S. Pat. No. 11,357,141, which is continuation-in-part of U.S. application Ser. No. 16/711,581 filed on Dec. 12, 2019, now U.S. Pat. No. 10,765,045, which claims the benefit of priority of U.S. Provisional Application having Ser. No. 62/883,696 filed on Aug. 7, 2019. U.S. application Ser. No. 16/905,406, and this utility patent application by chain of priority, claims priority to U.S. Provisional Application No. 62/863,394 filed on Jun. 19, 2019. This Application accordingly claims the benefit of priority of each of the above-referenced applications and hereby incorporates each by reference in its entirety.

TECHNICAL FIELD AND BACKGROUND OF THE INVENTION

This invention relates to shielding structures against radiation by the use of radiation absorbing coal combustion residual components ("CCR") and other carbon containing materials. More specifically, this invention relates to shielding against electromagnetic pulses (EMP), high-altitude electromagnetic pulses (HEMP), geomagnetic disturbances (GMD), and intentional electromagnetic interferences (IEMI). The application discloses structures utilizing CCR and other carbon containing materials as a radiation-absorbing material per se, and also techniques for enhancing the IEMI and EMP protection afforded such structures. Examples of structures utilizing CCR are disclosed in applicant's U.S. Pat. Nos. 9,790,703 and 9,988,317.

The world has grown dependent upon the use of electronics in nearly every facet of life. Safety, security, and normal day-to-day life heavily involve the use of electronics. Accidental and intentional conducted and radiated electromagnetic or geomagnetic emissions are capable of introducing damaging high electrical currents and voltages. These high currents and voltages are capable of causing disruption, data loss, and even permanent damage to the targeted electronics. An increased level of research and development is being carried out to protect critical structures, facilities, and components against these harmful emissions.

Prior art protection against radiation-induced damage has included geographic separation, redundancy, technical workarounds, or repair procedures as long as parts are available.

This application discloses constructing an Intentional Electro-Magnetic Interference (IEMI) protective barrier using Coal Combustion Residuals (CCR) as a major component. These barriers can be constructed around EMP protective, or non-protected EMP structure(s) to provide the additional IEMI protection. IEMI protective walls can be used to protect many types of critical infrastructure systems as outlined by CISA but specifically control centers and electrical substations for utilities will be a sector that IEMI protective structures will provide much needed protection.

It has been verified by testing that CCR absorbs IEMI electromagnetic energy at a greater effective rate than common soils. This greater absorption characteristic of CCR allows for a superior IEMI protective barrier and at the same time allows for the beneficial use of CCR.

The IEMI barriers can be built with spaced, framed panels, but the preferred embodiment is to construct an IEMI protective barrier berm using CCR. Using CCR in this beneficial use will allow not only for IEMI protection but also protection from other destructive forces that an adversary may use to damage critical infrastructure, as was perpetrated on Apr. 16, 2013 by the Metcalf sniper attack on Pacific Gas and Electric Company's Metcalf Transmission substation in Coyote, California.

The variables for IEMI protective construction apply regarding liners, liner placement, encapsulation, low leaching/low permeability, slope stability, mesh, and mesh placement.

Protection against radiated and conducted electromagnetic emissions such as HEMP/EMP, GMD, and/or IEMI can be accomplished by the electromagnetic shielding methods and devices described in this application. Shielding can be applied to CCR facilities and the components, systems, and subsystems which make up the facility and/or the CCR material itself.

Shielding against radiated emissions is accomplished through creating a highly conductive surface around a protected area to reflect and/or absorb radiated energy so it does not cause damage. The highly conductive surface is able to redirect and/or absorb the radiated energy to prevent or minimize exposure to damaging electromagnetic energy. Conducted emissions are generally diverted or blocked through the use of filters with discrete components that pass desired energy and block undesirable or damaging energy before it enters a protected area. Shielding of radiated and conducted emissions can be accomplished through one or a combination of methods and devices described in this invention.

Additionally, EMP has three components which are commonly referred to as E1, E2, and E3. These components vary by frequency, intensity, and longevity. Shielding against each of these components may be accomplished by different methods and techniques. One or multiple layers of conductive mesh may be positioned around the entire CCR structure, within the CCR material itself, around specific components or subsystems, or in natural earth geotechnical formations below or otherwise proximate to the CCR structure. Generally, conductive mesh will provide shielding from EMP events in a lower frequency range; however the size of the free air space within the mesh, commonly known as the mesh size, will be selected based on the desired frequency ranges that are required to be protected against.

Panels in accordance with the disclosure of this application can be fabricated using what is a known construction method called "tilt-up" concrete wall panel construction. Tilt-up concrete wall panel construction methods include preparing a casting bed, which is commonly the slab on grade of the building under construction. Once a casting bed is constructed, reinforcing steel bars or welded wire wires in a mesh are installed. The reinforcements are placed in the forms; the concrete is poured, finished and cured. After the concrete reaches the required strength, the panels are lifted (tilted-up) from the slab with a crane and then set into place and braced until other parts of the structure are assembled or constructed which will permanently secure the complete building structure and join the tilt-up concrete.

SUMMARY

This summary is provided to briefly introduce concepts that are further described in the following detailed descriptions. This summary is not intended to identify key features or essential features of the claimed subject matter, nor is it to be construed as limiting the scope of the claimed subject matter.

It is an object of the present invention to provide shielding against harmful radiated and conducted electromagnetic and geomagnetic emissions to structures by incorporating CCR components into these structures.

It is another object of the present invention to provide EMP, HEMP, GMD, and/or IEMI shielding to structures having CCR components.

These and other objects and advantages of the present invention are achieved in the preferred embodiments set forth below by providing an electromagnetic emission shield for protecting a coal combustion residue facility having a carbon-based material or other electronically conductive material. The shield may be formed into an arch and positioned inside an interior space of the coal combustion residue facility and a plurality of conductive mesh layers embedded into the carbon-based material.

In another embodiment of the invention an electromagnetic emission shield for protecting a coal combustion residue facility has a layer of carbon-based material positioned underneath the coal combustion residue facility and a plurality of conductive mesh layers embedded into the carbon-based material.

According to another embodiment of the invention, an electromagnetic emission shield is provided for protecting a facility having a volume comprised of coal combustion residue, the shield comprising a carbon-based material positioned inside an interior space of the coal combustion proximate to and interposed between a potential source of electromagnetic emission and the facility.

According to another embodiment of the invention, at least one electro-conductive mesh is embedded into the carbon-based material.

According to another embodiment of the invention, the shield comprises an enclosure having a weight-bearing arched roof.

According to another embodiment of the invention, the shield includes an enclosure having a weight-bearing arched roof, vertical side walls surrounding the facility, and a slab floor.

According to another embodiment of the invention, the slab floor is undergirded with coke breeze in which is embedding at least one layer of electro-conductive mesh.

According to another embodiment of the invention, vertical side walls are welded to the roof.

According to another embodiment of the invention, an EMP-protective composite structure is provided and includes at least one enclosure having walls, a ceiling, at least one ingress/egress portal and a base, each of the walls, the ceiling, the ingress/egress portal and the base including at least one blast-resistant structural panel and at least one layer of an EMP barrier comprised of CCR that provides magnetic conduction, field absorption and field reflection fully-enclosing the structural panel. The blast-resistant structural panel includes a frame constructed of spaced-apart frame members of a ferrous material or other electrically conductive material, frame reinforcing members or rebar extending between the frame members, a cementitious layer in which the frame is embedded and an EMP or rebar shielding mesh embedded in the cementitious layer. An encapsulation barrier includes an overlying layer of an impermeable cementitious material having a blast-deflecting surface defining an acute blast-deflecting angle with respect to a major plane of the base overlying the at least one enclosure, and a HEMP protective door is formed in the enclosure to absorb and deflect EMP.

According to another embodiment of the invention, the encapsulation barrier comprises an overlying layer of an impermeable cementitious material and a layer of vegetation overlying the layer of impermeable cementitious material.

According to another embodiment of the invention, the blast-resistant structural panel includes an expansion joint extending along a major side thereof for joining the structural panel to a like structural panel that allows for movement of the structural panel relative to other joined structural panels due to expansion and contraction while maintaining intact EMP protective features.

According to another embodiment of the invention, the enclosure includes a plurality of structural panels joined to form enclosed spaces equipped to perform the functions selected from the group of enclosed spaces consisting of operations center, living quarters, communications, data center, mess hall, kitchen facilities, restroom, shower facility, laundry, storage for food, water, medical supplies and equipment, apparel and hygiene-related supplies and equipment, generators, battery storage, transformers, power substation, power plant SCADA system; fuel supply, storage for spare and replacement parts for operating equipment.

According to another embodiment of the invention, a circuitous path extends from an exterior of the EMP-protective structure, through the encapsulation barrier and to the at least one ingress/egress portal of the enclosure, the circuitous path configured to absorb and deflect EMP as the EMP passes along the circuitous path, wherein the circuitous path comprises a labyrinth having a plurality of right-angle turns, curves, spirals, or baffles though the EMP barrier that provides a two-stage shielding system,—a high frequency "absorptive" section, and a lower frequency "Waveguide" magnetic and electric field exclusion system. The circuitous path shields against magnetic field conduction and electric field radiation through absorption and field reflection with respect to electromagnetic radiation entering the path from the exterior of the EMP-protective structure.

According to another embodiment of the invention, a structural panel for use in constructing an EMP-protective composite structure is provided, the structural panel including spaced-apart frame members of a ferrous material, frame reinforcing members extending between and connecting the spaced-apart frame members; and a cementitious layer in which the frame is embedded.

According to another embodiment of the invention, an EMP absorbing mesh is embedded in the cementitious layer.

According to another embodiment of the invention, the blast-resistant structural panel includes an expansion joint extending along a major side thereof for joining the structural panel to a like structural panel that allows for movement of the structural panel relative to other joined structural panels due to expansion and contraction while maintaining intact EMP protective features.

According to another embodiment of the invention, an insulation layer is provided coextensive with a major surface of the panel.

According to another embodiment of the invention, the panel is adapted to be fabricated in a horizontal position and then tilted in situ into an upright position to form a part of the enclosure.

According to another embodiment of the invention, the cementitious layer is selected from the group consisting of lightweight concrete, epoxy concrete, ultra-high performance concrete and autoclave concrete.

The above summary is to be understood as cumulative and inclusive. The above described embodiments and features are combined in various combinations in whole or in part in one or more other embodiments. Not all features are expressly described and illustrated as combined with all other features. All such combination are nonetheless disclosed herein, at least by this statement, whether or not appearing expressly in the drawings and descriptions.

BRIEF DESCRIPTION OF THE DRAWINGS

The previous summary and the following detailed descriptions are to be read in view of the drawings, which illustrate some, but not all, embodiments and features as briefly described below. The summary and detailed descriptions, however, are not limited to only those embodiments and features explicitly illustrated.

DETAILED DESCRIPTIONS

Figure 2:
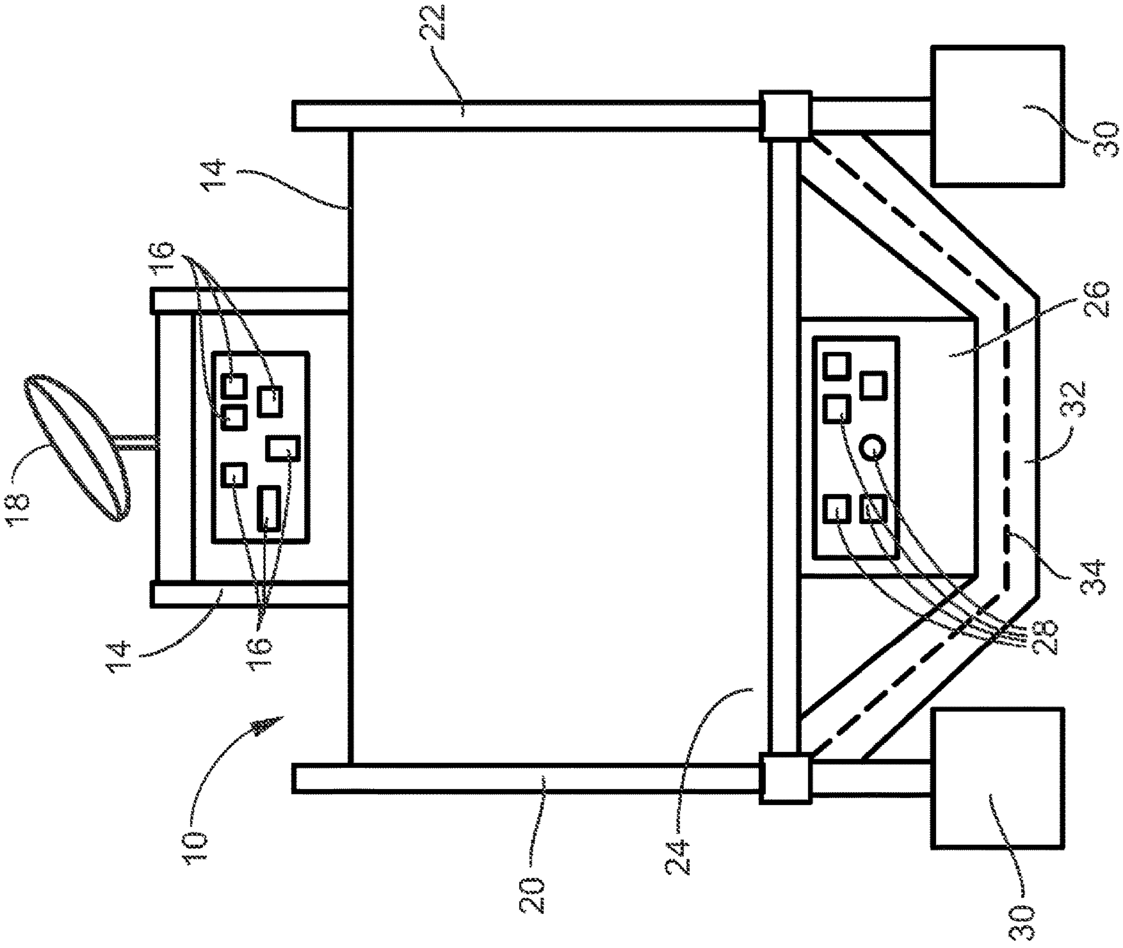
FIG. 2 is a side elevation/cross section of the protective structure shown in FIG. 1.

These descriptions are presented with sufficient details to provide an understanding of one or more particular embodiments of broader inventive subject matters. These descriptions expound upon and exemplify particular features of those particular embodiments without limiting the inventive subject matters to the explicitly described embodiments and features. Considerations in view of these descriptions will likely give rise to additional and similar embodiments and features without departing from the scope of the inventive subject matters. Although steps may be expressly described or implied relating to features of processes or methods, no implication is made of any particular order or sequence among such expressed or implied steps unless an order or sequence is explicitly stated.

Any dimensions expressed or implied in the drawings and these descriptions are provided for exemplary purposes. Thus, not all embodiments within the scope of the drawings and these descriptions are made according to such exemplary dimensions. The drawings are not made necessarily to scale. Thus, not all embodiments within the scope of the drawings and these descriptions are made according to the apparent scale of the drawings with regard to relative dimensions in the drawings. However, for each drawing, at least one embodiment is made according to the apparent relative scale of the drawing.

Like reference numbers used throughout the drawings depict like or similar elements. Unless described or implied as exclusive alternatives, features throughout the drawings and descriptions should be taken as cumulative, such that features expressly associated with some particular embodiments can be combined with other embodiments.

Unless defined otherwise, technical and scientific terms used herein have the same meaning as commonly understood to one of ordinary skill in the art to which the presently disclosed subject matter pertains. Although any methods, devices, and materials similar or equivalent to those described herein can be used in the practice or testing of the presently disclosed subject matter, representative methods, devices, and materials are now described. All materials described are provided as non-limiting examples except where their inclusion is positively and unambiguously asserted. Thus, once materials and arrangements are described herein with reference to any structures and elements thereof, for example in the drawings, such descriptions apply as well to any further same or similar structures and elements that may appear in other drawings.

The embodiments shown in the drawing have certain features in common which are described below before providing specific details of the individual drawings. In general, enhanced radiation absorption in CCR structures is achieved by use of various panels and walls that include a radio frequency shielding mesh. The mesh may be welded, woven wire fabric, tied together with tie wire to form a continuous secure connection, formed with end loops having a threaded round or oval bar that runs perpendicular to the loops to tie the sections of mesh together, or formed with a hook and claw method. The mesh may be made of carbon steel, or any other material that can effectively conduct electricity and/or magnetic fields. The mesh may be coated and/or dipped to prevent corrosion. Corrosion may be due to the varying pH balances in the CCR material. Commercially available industrial coatings are envisioned as well as specifically developed coatings.

Conductive material, other than meshes, which produce the same or similar results, may be placed within the CCR structure, components, or CCR material itself. Shredded scrap metal, such as from vehicle shredders, steel fibers, textured glass, and other similar products can be utilized in and around structures having CCR components. Textured glass and shredded scrap metal may be used. These materials can be mixed directly into the CCR material itself, or formed into defined sections placed in and/or around the structure, for example arched, vertical, and/or horizontal formations. The material could also be placed in a section of soil located in the CCR structure or below the slab-on-grade portion of the interior structure which may be designed to be in a carbon-based material (a.k.a. carbon-containing material), other than CCR, CCR and soil, or any other acceptable material that will provide the desired shielding.

EMP absorption may be optionally enhanced by various additives and constructions which increase carbon content of the CCR structure. Some CCR structures already have high carbon content and may not require any enhancement. A carbon-based material, such as coal coke breeze or pet coke, may be in the form of an additive within the CCR material itself, or positioned as a defined construction proximate to or within the interior space of the CCR structure to enhance absorption within a defined frequency range. Carbon-based material may be used singularly or in combination with other carbon enhancing materials. It is also envisioned that carbon-based material may be attached to a liner or other barrier.

CCR material compositions typically vary in carbon content within a specific site or different sites. This variation may determine the size, type, and/or thickness of other elements of the CCR shielding required. These variables will be the main determining factors in the amount and extent of any carbon enhancing material required.

An arch is one specific technique for providing shielding of the type envisioned in this application. The percentage of carbon in the arch may be determined by the aforementioned site-specific variables, or a general predetermined amount, and the placement of the interior spaces in relationship to the bottom of the CCR. It is envisioned that the other shapes or configurations such as vertical sides and horizontal top/bottoms may be utilized in combination with arch structures. Construction of vertical wall/panel sections may be accomplished by using construction trench boxes. A floor shield may also be formed of mesh and/or a defined layer of a carbon-based material positioned underneath the floor of the interior structure. The entire mass of CCR material itself can be increased in carbon content in lieu of placement within the CCR structure depending on the type and amount of electromagnetic shielding required.

A combination of carbon enhancing material and mesh may be utilized to prevent electromagnetic or geomagnetic forces from penetrating upwards into the interior spaces of the CCR structure. While two layers of mesh and three layers of carbon enhancing material are shown, the amount, type, and thickness of the layers is dependent upon site specific requirements. The mesh may be fastened to sheet piling or spaced frame metal panels by welding, bolted bus bar type connection, and/or any other fasteners that are capable of producing a continuous metal to metal connection. Mesh from the exterior side of the interior space wall may be connected at an equal elevation or a lower elevation point to create a continuous 360 degree shielding around the interior spaces.

When the interior spaces of a CCR structure are constructed out of precast concrete or poured-in-place concrete, a metal plate may be inserted into the concrete to have a connection point for the mesh on both the interior and exterior sides of the interior space. Often it is necessary to test the properties of the installed shielding. A system for testing may be integrated into the CCR facilities for continuous or discrete testing. One testing system has multiple loop coils which may be energized so that the amount of energy emanating into the protected areas may be measured. These measurements enable the shielding effectiveness to be calculated so that the integrity of the shielding can be determined. Testing may also be accomplished by directly energizing conductive meshes around the facility using different frequencies and power levels so that shielding effectiveness may be calculated in protected areas to give confidence in the overall level of shielding that is present inside the CCR structure.

Radio frequency (RF) absorption can be tested using specially fabricated probes. These probes use copper tubes that have a pre-determined cross section diameter and length (for example, 1 inch in diameter and 10 feet in length) with caps and/or attachments that allow for the use of demountable components such as RF-type connectors, clips, or other means of connecting/disconnecting the probes.

The probes are energized with RF energy of any frequency. A typical frequency range is from 10 kHz to 1 GHz or higher for IEMI. RF energy is injected on one end of the probe, and the remaining energy is removed on the opposite end of the probe. The probes can be used to characterize the absorption properties of any material. The difference between injected energy and harvested energy is the absorption of energy along the probe. When the probe is placed or buried within various materials the inherent ability to absorb RF of the material surrounding the probe may be determined when a frequency of a predetermined bandwidth is swept across the spectrum. Additionally, when the probes are buried in CCR, the ability of CCR to absorb, for example, HEMP/EMP energy from 10 kHz to 1 GHz can be determined. This allows for the suitability of CCR for HEMP and IEMI shielded structures to be determined.

Air and/or personnel entryways into the CCR structure may be created through the use of an RF absorber in conjunction with a Waveguide Below Cutoff (WBC). The entryway will be comprised of an RF absorber, such as encapsulated CCR, coke breeze, MET coke, PET coke (containing varying percentages of carbon) or other carbon or non-carbon absorbing material with welded steel or welded steel mesh embedded in the RF absorber and configured to create a WBC. The entryway will function such that low frequency electromagnetic waves will be blocked by the WBC and higher frequency electromagnetic waves (above the cutoff frequency) will be absorbed by the RF absorber thereby creating a personnel or air entryway capable of blocking RF energy without utilizing an RF door. The entryway path may or may not curve or turn to help facilitate RF absorption. The entryway may include rudimentary RF shielding doors, turnstiles, or other RF absorbing features to improve overall RF shielding performance.

The removal of RF energy from wires, cables, conduits, pipes or other metallic fixtures may also be necessary. Wires, cables, conduits, pipes or other metallic fixtures may be embedded within materials such as encapsulated CCR, coke breeze, MET coke, PET coke (containing varying percentages of carbon) or other carbon or non-carbon absorbing material to significantly reduce high-frequency RF energy. This has applications for power lines, signal lines (such as those in power substations), control lines (such as those in power substations), and metallic pipes (such as water/sewer/gas lines) that may not be otherwise configured to exclude RF energy.

An electromagnetic filter may be created out of utility-grade discrete components. Air-core inductors, or other types of inductors that are of the type in use by electric utilities along with capacitors of the type that are used by electric utilities for power factor correction, or other purposes may be used to create a filter. This filter can be utilized independently or in conjunction with other filters to provide a range of frequencies or attenuation levels required by a particular application. One example is a HEMP filter (from 10 kHz to 1 GHz or more).

Medium-voltage power bus bars may be created to feed power into a CCR structure. The bus bar may be 10 ft or longer in length and of sufficient cross-section to transmit electrical power without excessive heating. The bus bar may not conduct significant amounts of RF energy. The bus bar may be insulated with nylon, PVC, Sulfur Hexaflouride Gas, or other insulating material or combination of insulating materials. The bus bar may be embedded in encapsulated CCR, coke breeze, MET coke, PET coke (containing varying percentages of carbon) or other carbon or non-carbon absorbing material which will act as an RF absorber and will prevent significant RF energy from being transmitted by the bus bar. The bus bar may be used in conjunction with the filter to operate across the entire HEMP pulse spectrum.

This arrangement might be used for applications like electric power substation houses where multiple conductors may need to pass from an unshielded area to a shielded area, and applications (such as high-speed protective relays) that may not be compatible with conventional filters, as is sometimes the case. Grounding shields from the cables would be removed for the portion of the conductors that pass through the carbon containing absorbing material. However, the carbon RF filter is utilized it will be configured so that one end is outside of the shielded environment, and the other end is inside the shielded environment.

Inside of the RF shielded environment, other protective devices, such as metal-oxide varistors may be employed to reduce any remaining RF artifacts. With higher frequency RF artifacts removed, MOVs may be effectively employed.

Often when high-frequency artifacts are present, an MOV does not act fast enough to protect against conducted RF energy that may be damaging. With the higher frequency artifacts removed, the "rise time" of any RF energy will be significantly less, allowing for conventional and/or less expensive MOVs that have a slower rise-time response to be used to provide more effective protection to a conductor in a shielded environment.

One of the technical principles employed with this invention is called the "Skin Effect." The skin effect is the tendency of a high-frequency alternating current, such as radio frequency energy, to become distributed within an electrical conductor in a way that the current is mostly carried near the surface of a conductor (aka: "the skin" of the conductor). The depth of the "skin" is dependent upon frequency of the electrical current—so DC power would utilize the whole conductor, utility AC power would have very limited skin effect, because it is low in frequency, and RF energy from an EMP or IEMI or other RF source would flow mainly on the outside of a conductor. By flowing on the outside of the conductor, the RF energy is closer to the carbon-containing material that absorbs the RF energy. This allows the RF energy to be removed from the conductors as it propagates across the conductor. Another technical principle employed with this invention is "re-radiation" of RF energy that is travelling down a conductor. As RF energy frequency increases, the tendency for RF energy to reradiate from conducted energy to energy traveling in free-space (or within some other medium in which a conductor is placed) as it travels along the conductor. When the energy reradiates in carbon-containing material, it is absorbed and converted to heat by the carbon, which is the same principle that pyramidal carbon absorbers, commonly used in "anechoic chambers" or EMP testing chambers.

For applications with utility AC power or DC power from alternative energy (as examples, but not limited to these examples) the carbon-containing RF absorber will absorb any energy that is reradiated from a conductor inside of it. The effectiveness of the carbon-containing RF absorber will be dependent on the thickness of the RF absorber, with higher frequencies (that have a shorter wavelength) being absorbed by a shorter thickness of carbon material in which a given conductor may be embedded than for lower frequencies (with a longer wavelength).

The EMP Protective composite enclosure panel systems and materials in this application have unique features that allow for, if required, exceptional corrective and maintenance work which can be easily located and performed to allow for long-term Intentional Electro Magnetic Interference (IEMI) and EMP shielding, absorption and conductivity protection requirements of the system(s) for many decades, if not longer, to come.

IEMI weapons generally have a frequency spectrum from 80 MHz-10 GHz (or higher) and project either a narrow-band repetitive pulse, a wide-band repetitive pulse, or some other pulse modulation scheme designed to damage, disrupt, or upset electronic systems that are in their antenna focus area. The maximum field-strength beam of IEMI weapons is generally narrow (a few degrees wide in beam-width) and can often be aimed to focus on specific systems or areas of a building.

DETAILED DESCRIPTION OF THE PREFERRED EMBODIMENTS

Figure 1:
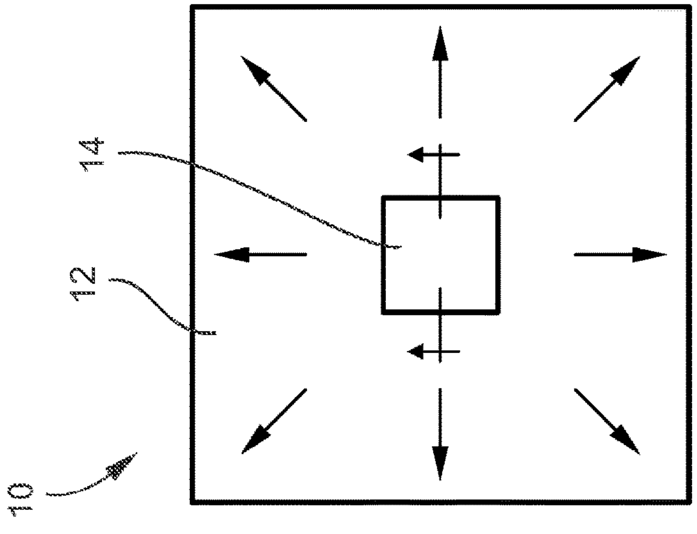
FIG. 1 is a top roof plan view of an EMP protective structure incorporating EMP absorbing materials such as meshes and coal combustion residuals and/or coke breeze.

Referring now specifically to the drawings, FIG. 1 is a roof plan of a structure 10 adapted to contain and protect any suitable facility from EMP. The structure 10 is surrounded by CCR acting as a primary EMP shielding (not shown). The structure 10 includes a roof 12 and a heavy, robust structure 14 that protrudes above the level of the roof 12 and contains wave guides 16 that are tuned to intercept EMP radiation at predetermined frequencies. The structure 14 may include a communications antenna 18, as shown. FIG. 2 illustrates that the structure 10 includes vertical slab walls 20, 22 with a slab floor 24 set on grade. An EMP protector panel 26 is set below grade, as shown, and includes wave guides 28 that are tuned to intercept EMP radiation at predetermined frequencies. The structure 10 is anchored below grade by large foundation piers 30. A below grade foundation pad 32 is positioned under the EMP protector panel 26 and includes a slab of an EMP absorbing material such as coke breeze into which is embedded a mesh 34, which may include multiple layers. The combination of the coke breeze and the mesh 34 provide enhanced EMP absorbing capability to the structure 10, which as noted above is embedding in a thick layer of CCR and one or more layers of mesh, not shown.

Figure 3:
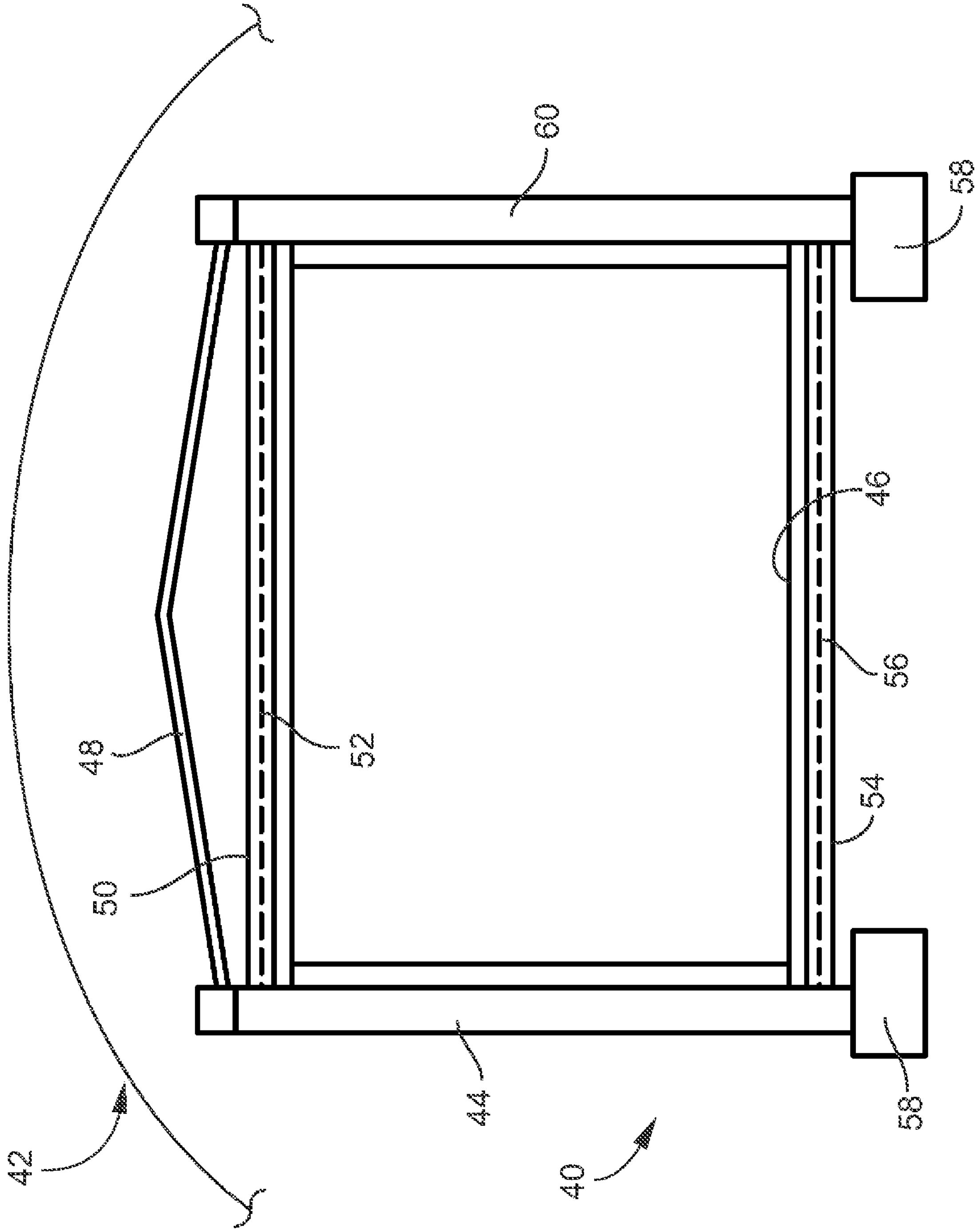
FIG. 3 is a side elevation/cross section of an EMP protective structure incorporating EMP absorbing materials such as meshes and coal combustion residuals and/or coke breeze.

FIG. 3 is a side elevation/cross section of an EMP protective structure 40 incorporating EMP absorbing materials such as coal combustion residuals and coke breeze. The structure 40 is shown surrounded by a large, deep volume of CCR. The entire structure is shown encapsulated in an additional layer 42 of dirt and/or CCR. The structure 40 includes vertical slab walls 44, 46 with a slab floor 46 set on grade. The structure 40 also includes a lightweight, sloped concrete roof 48. The top of the structure 40 is enclosed with a slab 50 of coke breeze in which is embedded one or more layers of a mesh 52. The combination of the coke breeze and the mesh 52 provide enhanced EMP absorbing capability to the structure 40. Similarly, the slab floor 46 is undergirded with a slab 54 of coke breeze in which is embedded one or more layers of a mesh 56. The structure 40 is anchored below grade by large foundation piers 58.

The meshes in the slabs 50 and 54 are welded and/or electronically connected to the vertical slab walls 44, 60, which are concrete and steel.

Figure 5:
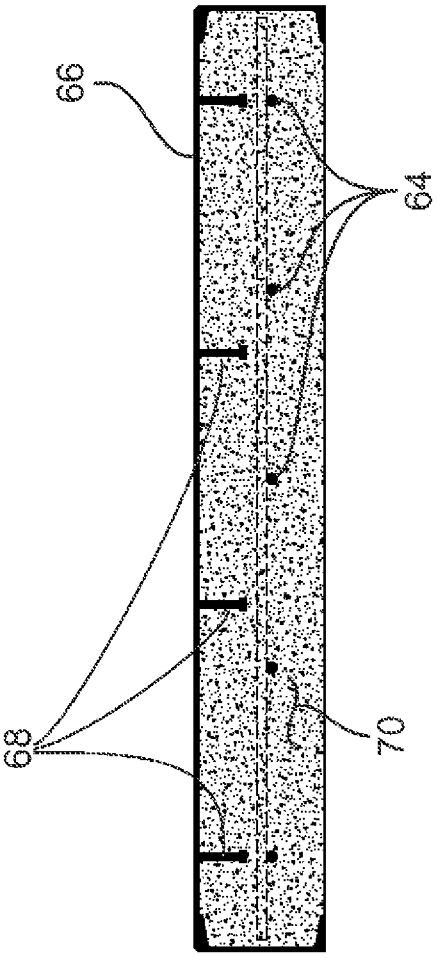
FIG. 5 is a side elevation of the wall section shown in FIG. 4.
Figure 4:
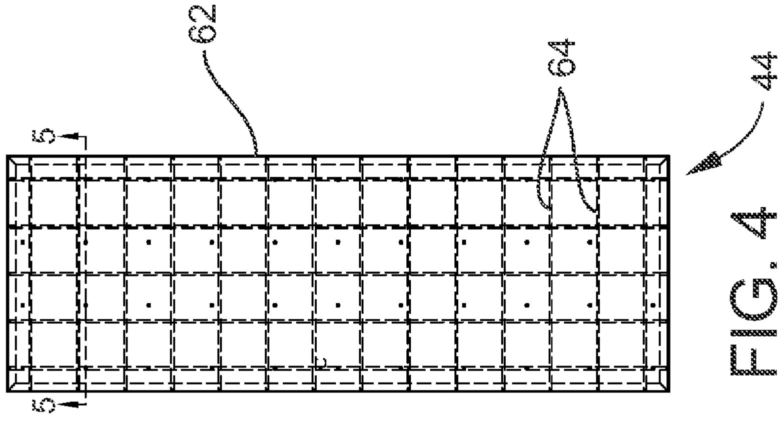
FIG. 4 is a front view of a wall section for use in EMP absorbing materials such as coal combustion residuals and coke breeze.

The details of the slab walls, for example wall 44, are shown in FIGS. 4 and 5. As shown, wall 44 is formed of a rectangular steel frame 62 and includes a grid of mesh 64 formed of an interlocked array of rebar or similar interlocking elongate elements placed in the concrete inside of the frame 62. As best shown in FIG. 5, the frame 62 has a back wall panel 66 to which are welded concrete anchor studs 68. The frame 44 thus forms a shallow vessel into which concrete is placed. This concrete can be EMP protective with the addition of carbon-based material as part of the concrete mix design, can provide a redundancy of EMP protective above the metal 66.

Figure 6:
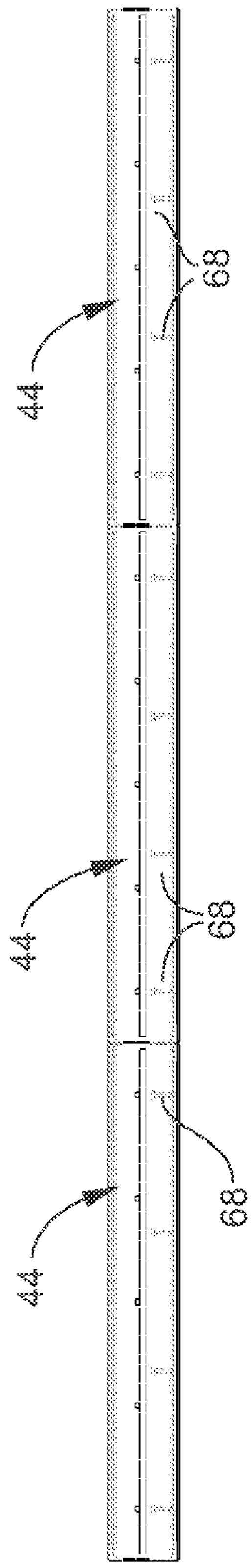
FIG. 6 is a top view of three wall sections of FIGS. 4 and 5.

FIG. 6 is a top view of three walls 44 of FIGS. 4 and 5, shown welded together end-to-end to form a three-wall panel.

Figure 7A:
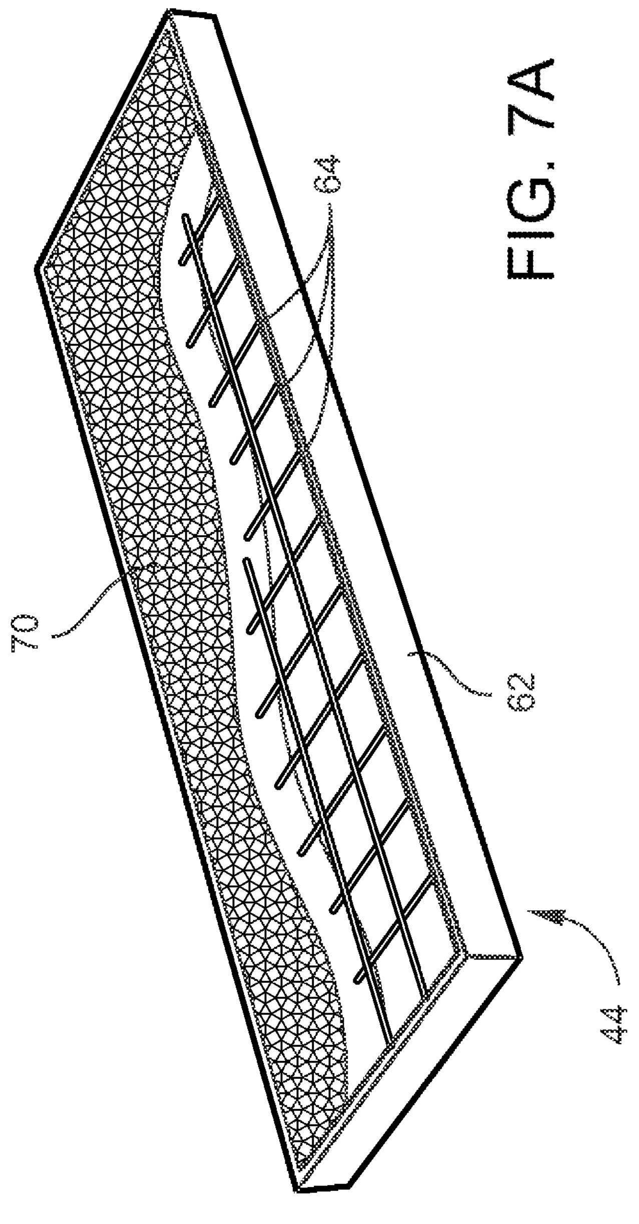
FIG. 7A is a perspective view with parts cut away of the wall section of FIGS. 4 and 5.

FIG. 7A is a perspective view with parts cut away of the wall 44 of FIGS. 4 and 5.

Figure 7B:
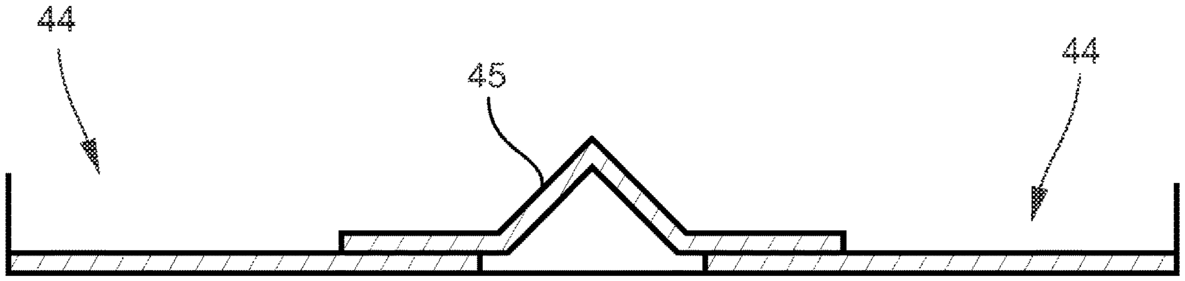
FIG. 7B is a cross-section of an expansion joint construction used to connect adjacent walls.

There are many different design features, which can be used when the panels, for example, wall panels 44, are used for vertical slab walls, floor, or roof components in a structure. FIG. 7B shows the use of an expansion joint 45 connected by welding adjacent vertical slab wall panels 44. The expansion joint 45 allows for movement of the structure due to expansion and contraction, but at the same time provides for the EMP and IEMI protective features to stay intact. The expansion joint 45 extends along the vertical length of the walls and spaces the adjacent wall panels shown by wall 44 apart. The expansion joints 45 are connected by continuous welds. The outwardly projecting face of the expansion joint 45 permits movement of adjacent wall panels 44 relative to each other. This movement is converted into a corresponding flexture of the expansion joint 45 in an outward and inward movement.

Figure 8:
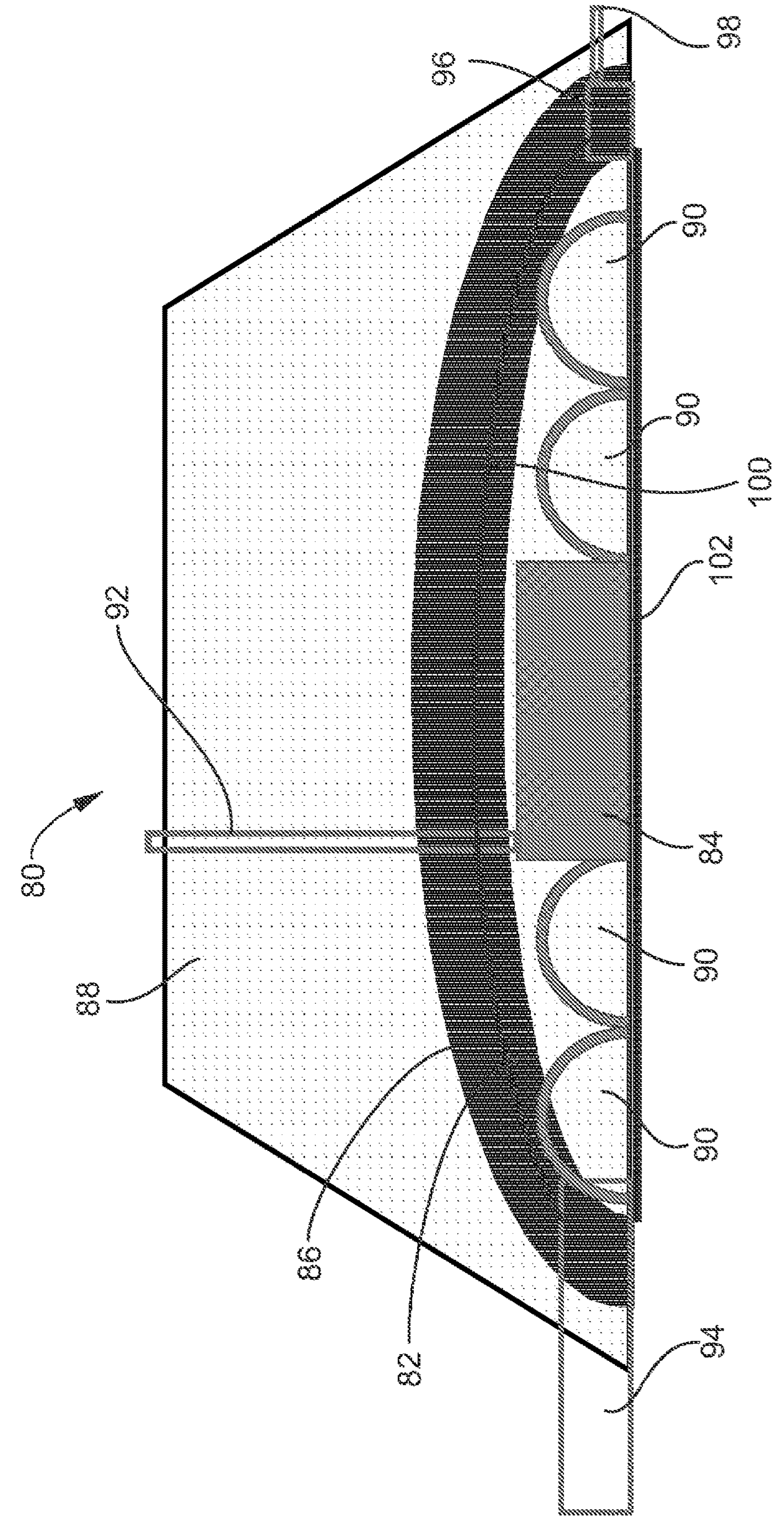
FIG. 8 is a schematic side elevation of an EMP Shielded facility incorporating coal combustion residuals and other EMP absorbing materials.

Referring now to FIG. 8, a schematic side elevation of an EMP Shielded structure 80 incorporating coal combustion residuals and other EMP absorbing materials. The design protects the structure 80 from damaging electromagnetic forces penetrating upwards from the ground or bottom portion into the interior spaces 90 and 84 of the structure 80. The structure 80 includes a shallow arch 82 constructed of carbon containing material such as coke breeze which contains one or more layers of mesh. An occupancy area 84 is positioned in the center of the structure 80. Also formed of pre-cast or poured-in-places reinforced concrete and in the embodiment of FIG. 8 are a series of parallel arched structures 90 that sit under the shallow arch 82 and are interior secure spaces. These structures 90 are overburdened with a relatively shallow layer of carbon-containing or carbon supplemented material 86, for example, containing 10 percent carbon, and a massively thick layer of CCR 88.

The structure 80 includes a shielded air intake 92, a shielded personnel/material entryway 94, a power filter vault 96, and a power entryway 98. Two layers of mesh shielding 100 reside within the relatively shallow layer of carbon-containing or carbon supplemented material 86. A floor plate 102, which may be a composite panels, steel plate, a mesh, or a combination of the two or more, embedded in carbon containing material such as coke breeze and/or CCR provides primary protection against electromagnetic energy penetrating upwards from the ground or bottom portion into the interior spaces of the structure 80.

Figure 9:
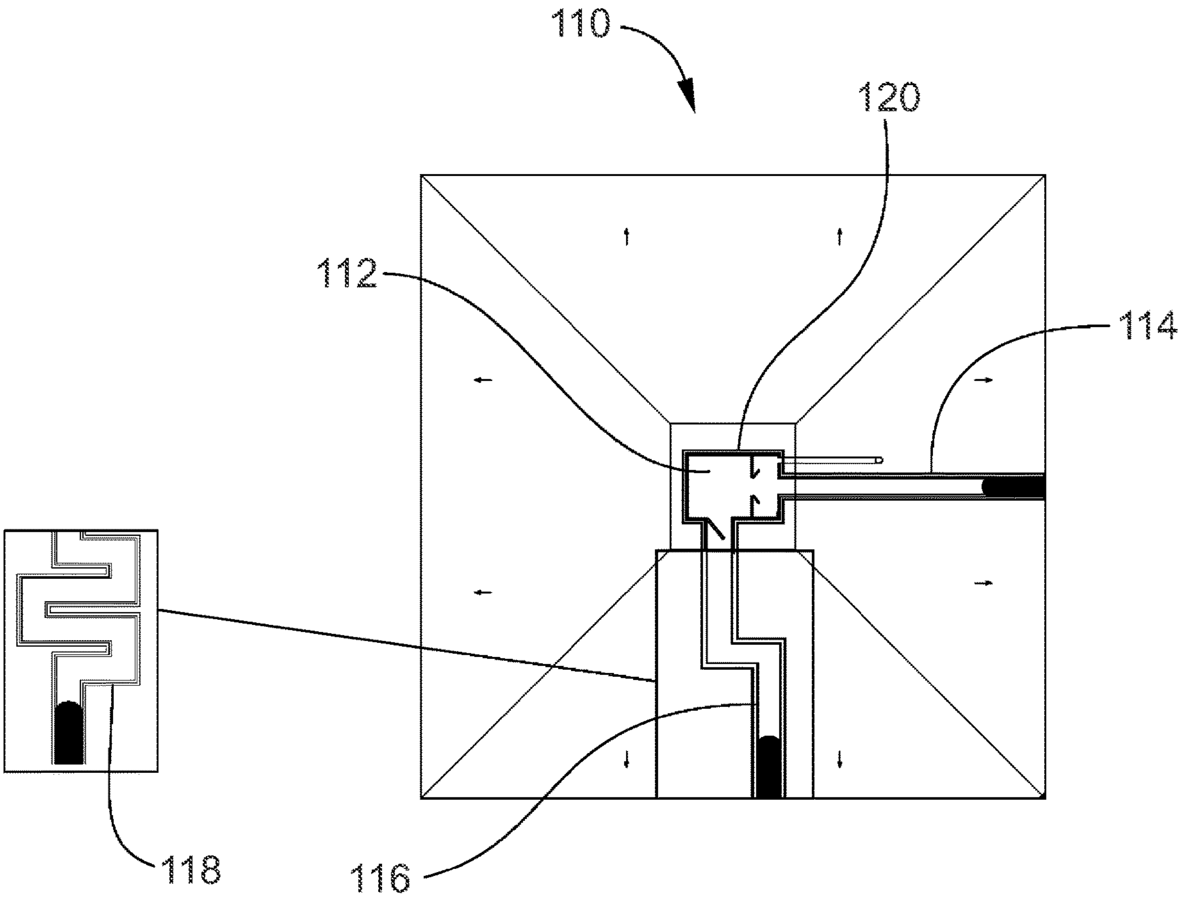
FIG. 9 is a top plan view of another protective structure incorporating EMP absorbing materials such as coal combustion residuals and/or coke breeze.
Figure 10:
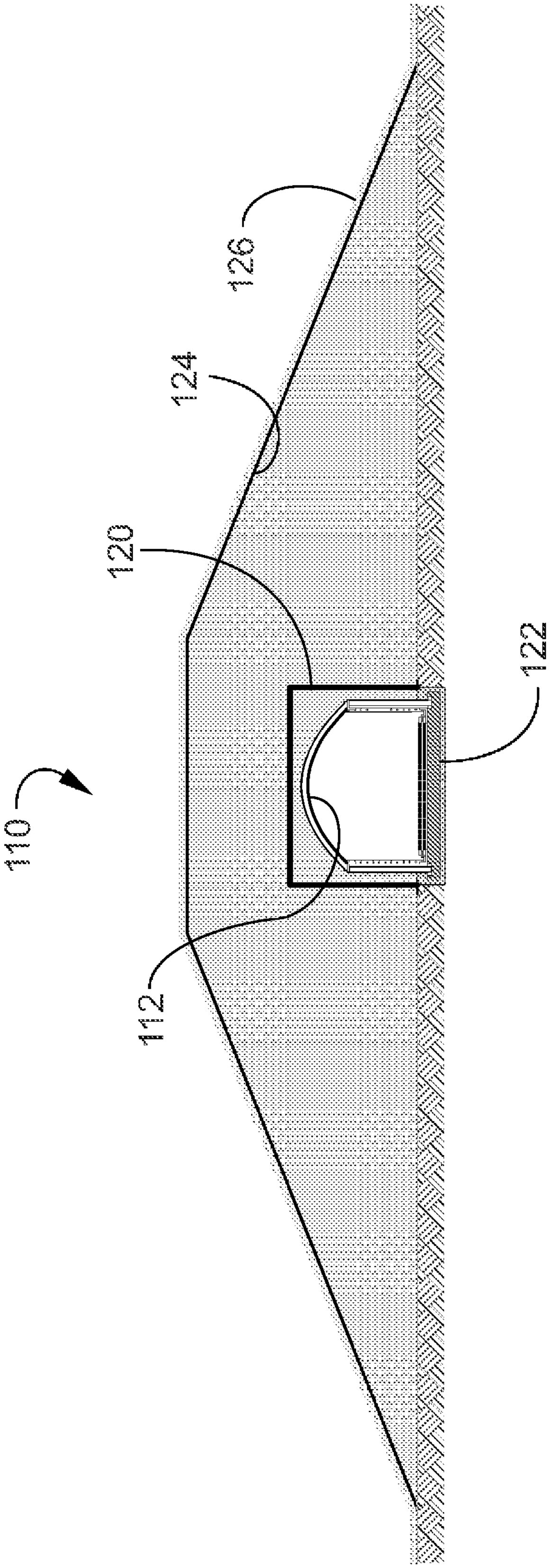
FIG. 10 is a side elevation of the protective structure shown in FIG. 9.

FIGS. 9 and 10 show a top plan and side elevation of another protective structure 110 incorporating EMP absorbing materials such as coal combustion residuals and/or coke breeze, by way of example, the structures shown in FIGS. 1-8 that provide enhanced protection, particularly for the sides and underside of the structures. The volume of the structure 110 is principally defined by CCR. A secure room 112 is accessed by a raceway 114 providing utilities and an emergency exit. An entryway 116 with a right angle jog provides normal ingress and egress. An alternative entryway 118 defines a labyrinth of right angle jogs that prevent electromagnetic intrusion. The entire secure room is surrounded by low frequency mesh shielding 120 as described above. As best shown in FIG. 10, the secure room 112 is protected from the bottom by a slab floor 122 containing coke breeze and one or more layers of mesh as an EMP absorbing material. The structure 110 may be covered with a HDPE cover 124, over which may be placed a vegetative cover 126 that provides temperature control and camouflage.

Figure 11:
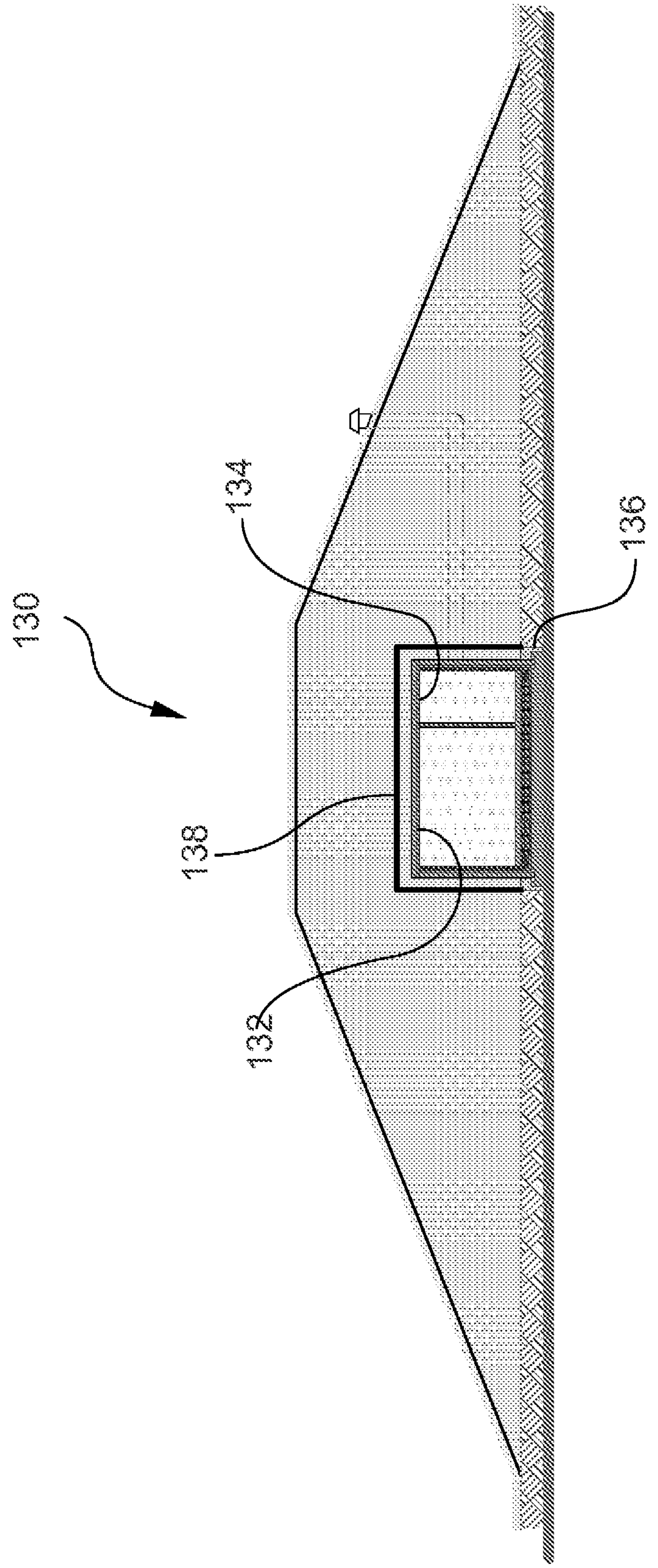
FIG. 11 is a side elevation of an alternative protective structure.

Referring to FIG. 11, an alternative protective structure 130 is shown, which has a volume defined principally by CCR. The sloped sides enclose secure rooms 132, 134 the bottom of which is protected by a slab 136 containing coke breeze and one or more layers of mesh. The perimeter of the rooms 132, 134 is surrounded by low frequency mesh shielding 138 as defined in this application.

Figure 12:
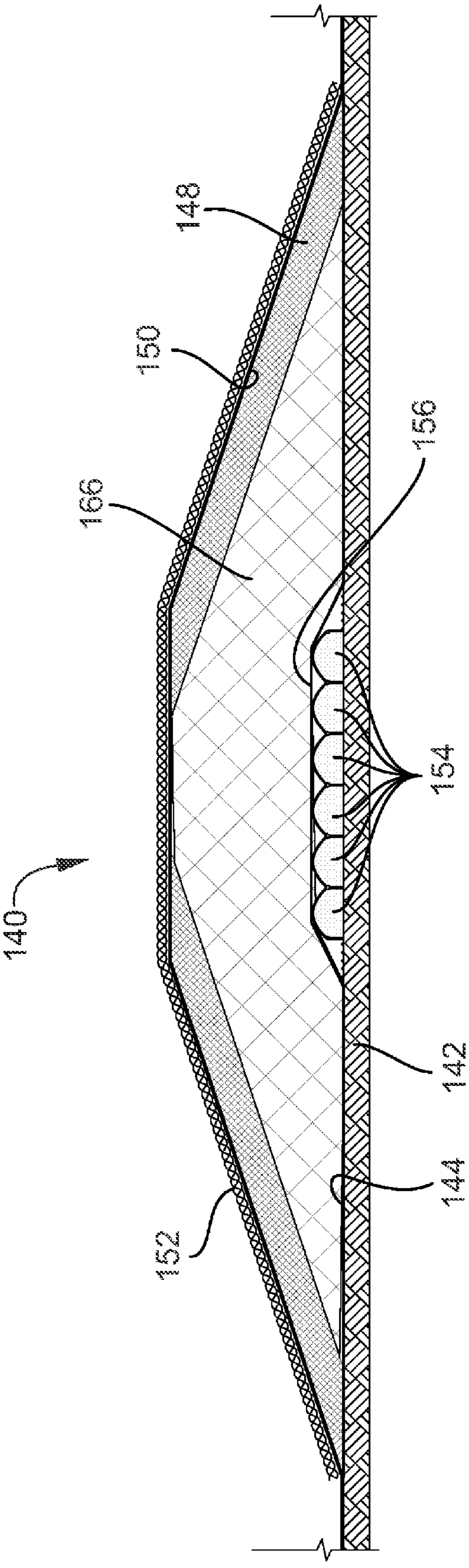
FIG. 12 is a side elevation of another alternative protective structure.

FIG. 12 is a side elevation of another alternative protective structure 140 and may be any desired size, including for example, 13.5 million cubic yards. The structure 140 rests on a conventional prepared subgrade foundation 142 covered with a liner system 144 that prevents any runoff from the structure 140 from entering the ground through the foundation 142. The principal component of the volume of the structure 140 is densely-compressed CCR 146 that is encapsulated under a reinforced CCR cap 148. A liner system covering 150 encloses the CCR 146 and CCR cap 148. All or part of the structure 140 may be covered with soil and vegetation 152.

As shown in FIG. 12, the structure 140 has severely-sloped sidewalls designed to deflect a blast proximate the structure 140. The structure 140 is adapted to store, for example, bulk storage items in separate reinforced rooms 154 protected by a further reinforced enclosure 156. Rooms 154 and the reinforced enclosure 156 are constructed according to the construction principles utilizing the composite enclosure panel system identified in this application to achieve an EMP-protected area within the structure 140.

Figure 13:
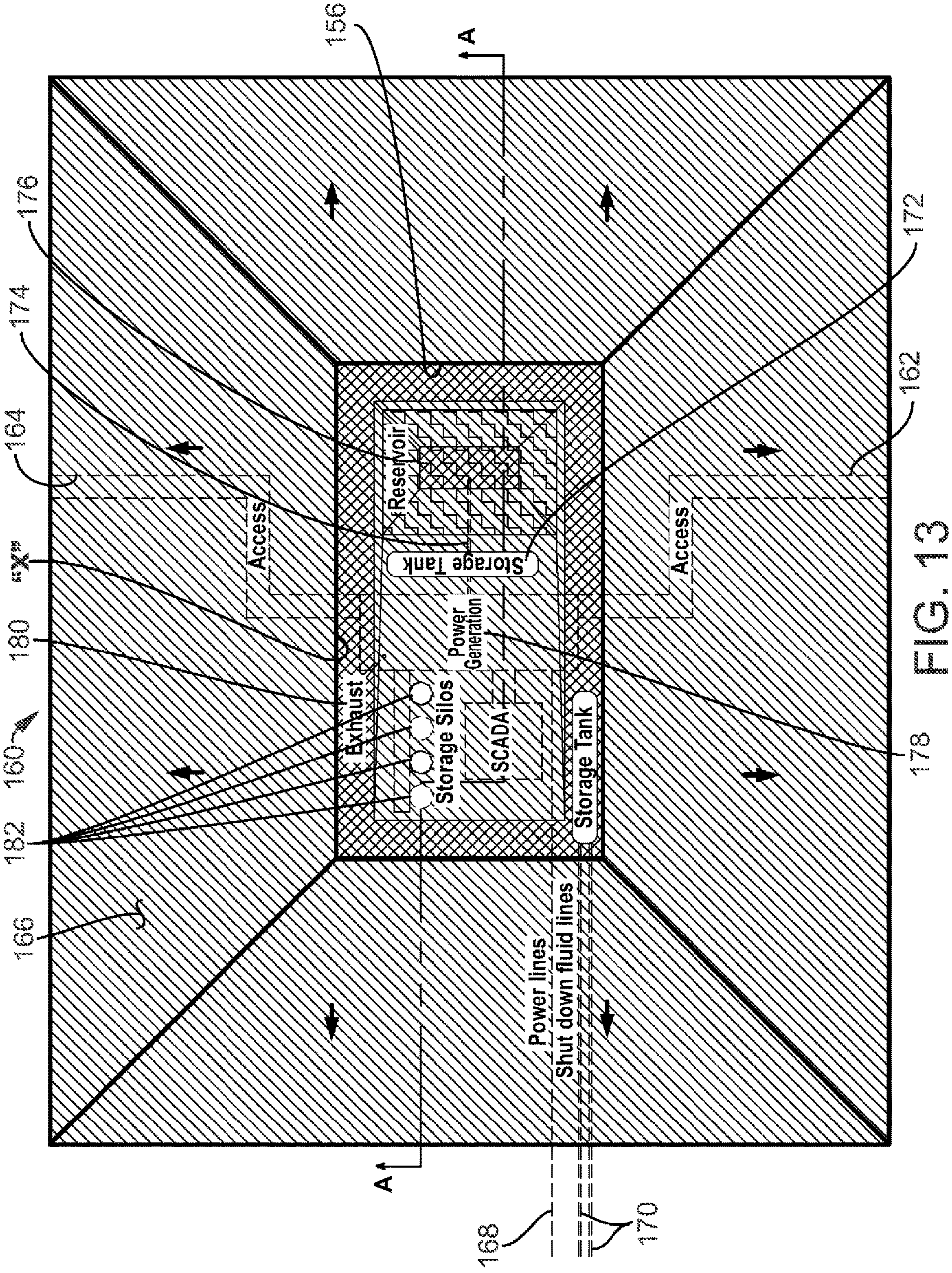
FIG. 13 is a top plan view of a protective structure showing details of secure room facilities.
Figure 14:
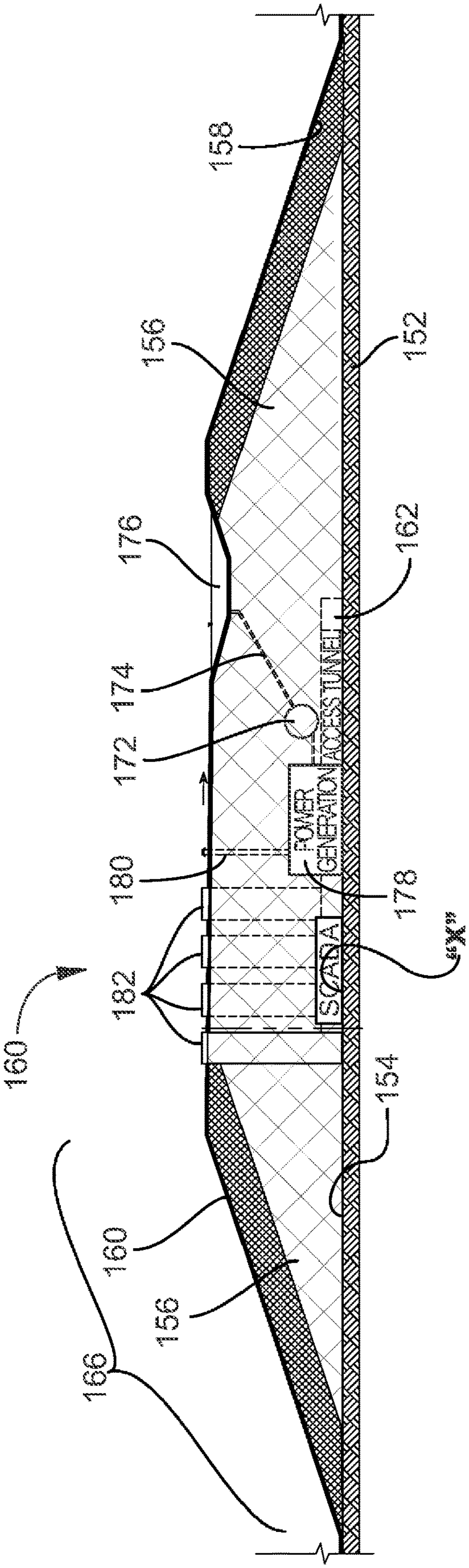
FIG. 14 is a side elevation of a protective structure showing details of secure room facilities.

FIGS. 13 and 14 are a top plan view and side elevation of a protective structure 160 showing details of secure room facilities that include labyrinth-type ingress/egress access tunnels 162, 164 within sloping walls 166 that connect the exterior of the structure 160 with the interior "X" of the structure 160. The interior "X" of the structure 160 includes necessities for sustaining life for an extended time, including lines 168 delivering electric power to the structure 160, fluid lines 170 for delivering and conveying away water, sewage and the like, a water storage tank 172 that can be gravity fed when necessary through a feed line 174 from a reservoir 176. Electric power can be generated by a generator 178 when electric r current from exterior the structure 160 is not available. Combustion gases from the generator 178 and ventilation of other gases is by an exhaust stack 180. Storage silos 182 provide storage for food, water and any other materials that are required.

Figure 15:
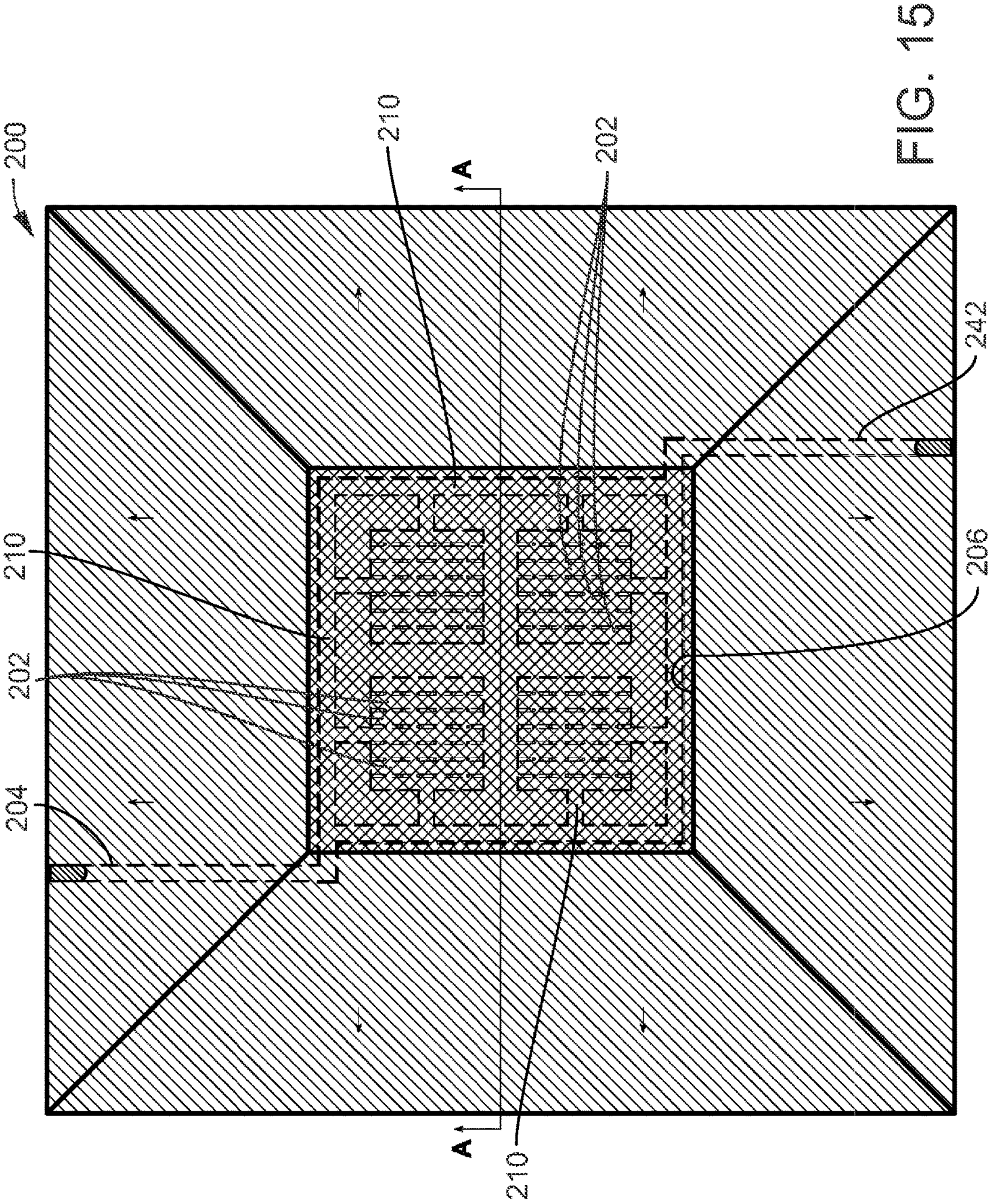
FIG. 15 is a top plan view of an alternative protective structure indicating secure rooms protected by the structure.

FIG. 15 is a top plan view of an alternative protective structure 200 indicating secure rooms 202 protected by the structure 200. This structure 200 may be any desired size, including for example, 13.5 million cubic yards comprising compacted CCR. Continued reference to FIG. 15 indicates labyrinth-type ingress/egress access tunnels 204, 242, 206 that connect the exterior of the structure 200 with the rooms 202. The rooms 202 are connected by passageways 210 that connect with the access tunnels 204, 242, 206, and 210.

Figure 16:
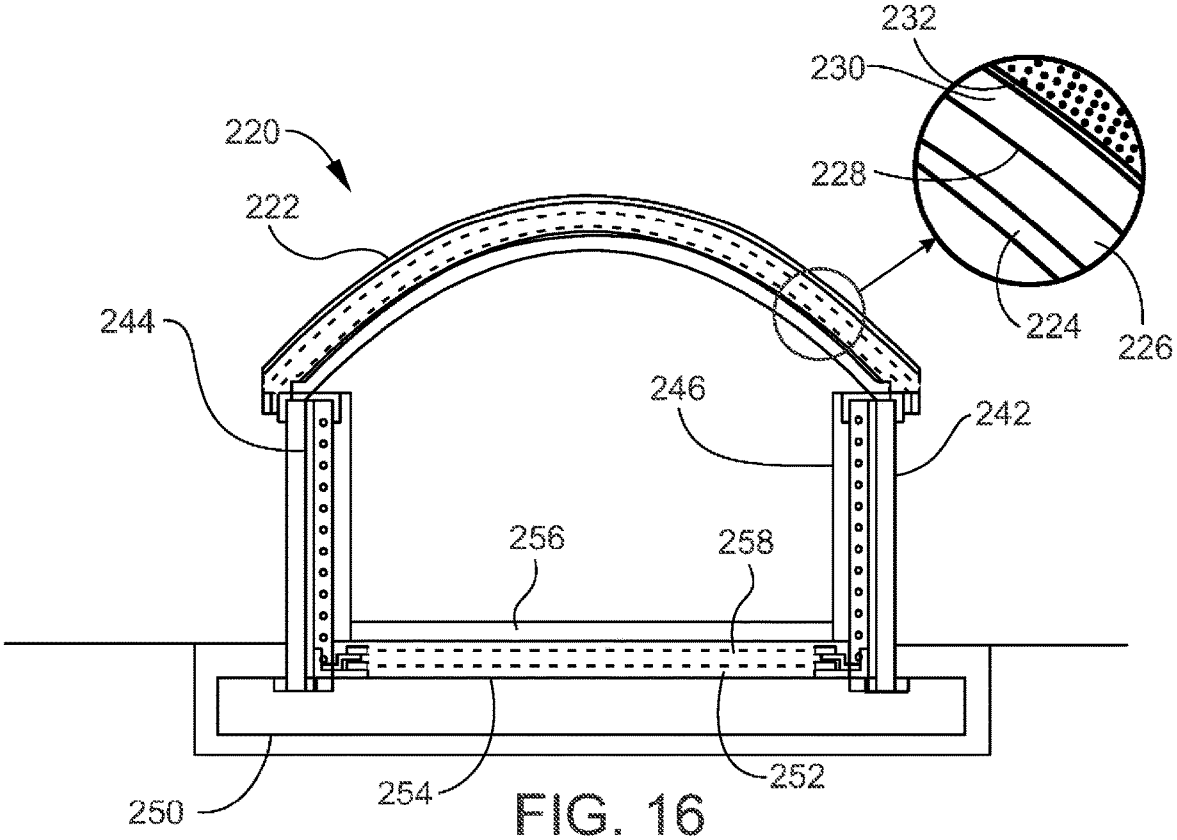
FIG. 16 is a side elevation view of a dome-shaped EMP protective structure.
Figure 17:
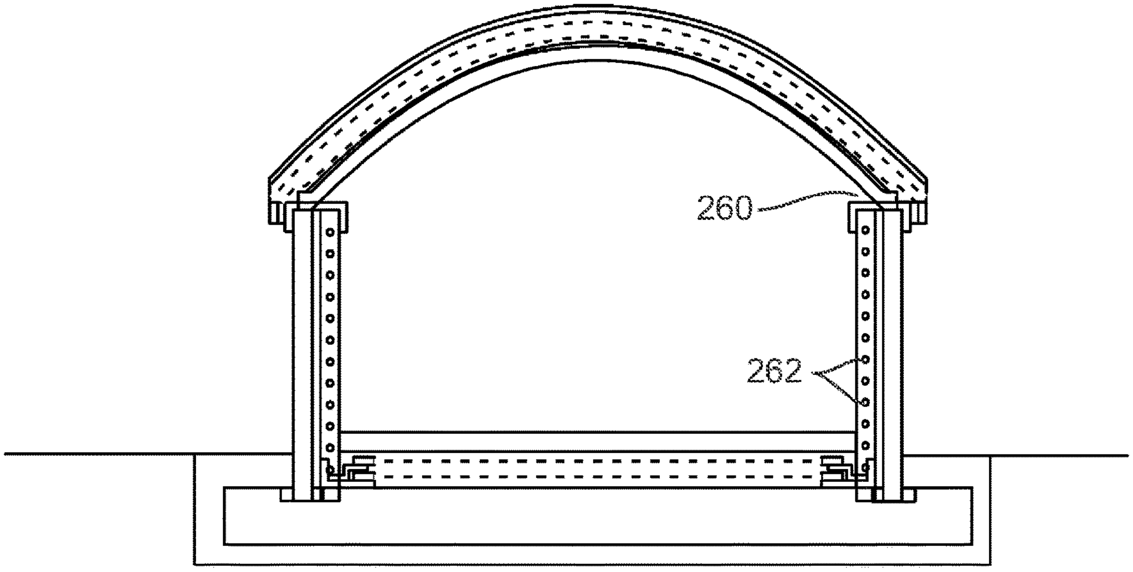
FIG. 17 is a side elevation view of a dome-shaped EMP protective structure.

Further details of the manner in which various structures are provided with enhanced EMP protection are shown in FIGS. 16 and 17. In FIG. 16 a protective structure 220 is enclosed within a larger structure comprising compacted CCR, as described and shown above. The structure 220 includes an arched roof 222 formed of layers of specific materials designed to provide enhanced protection against EMP. An innermost steel plate 224 provides structural support for a concrete layer 226, which is overtopped by a layer 228 of waterproofing, and a layer 230 of EMP absorbing coke breeze. A vapor barrier 232, for example HDPE encloses the entire roof 222.

The sidewalls 244, 242 of the structure 220 include an exterior concrete structure 242 supported by a metal casement 244. A further secondary non-structural carbon heavy concrete layer 246 provides innermost protection. The base of the structure 220 is supported on crushed stone, for example, a six-inch bed 250 of ¾ inch stone. A mat foundation 252 enclosed within a vapor barrier 254 supports the sidewalls 240. The mat foundation 250 supports a slab 256 formed of, for example, a 6 inch concrete slab on grade. The coke breeze 252 includes embedded EMP absorbing mesh 258 extending throughout the length and width of the coke breeze or other carbon containing material.

Further details of the metal casement 244 are shown in FIG. 17, and include continuous welds 260, holes for rebar placement 262, and mesh 258 with flat bars 254.

Figure 18:
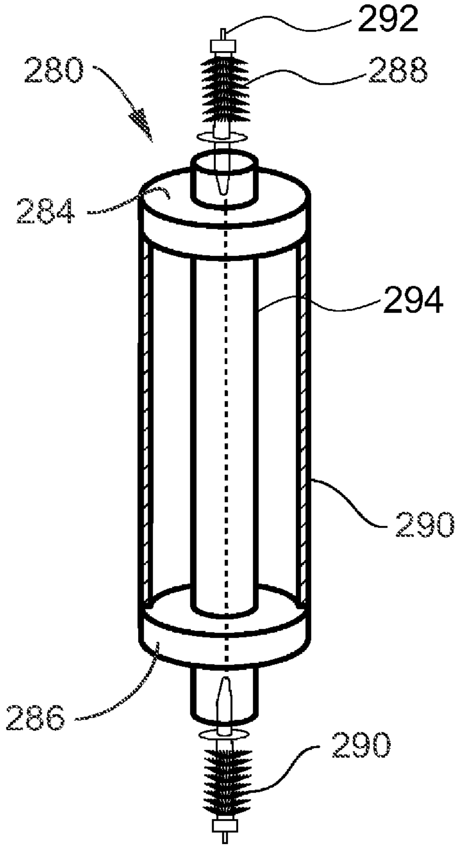
FIG. 18 is a perspective view of a carbon-based radio frequency (RF) filter.
Figure 19:
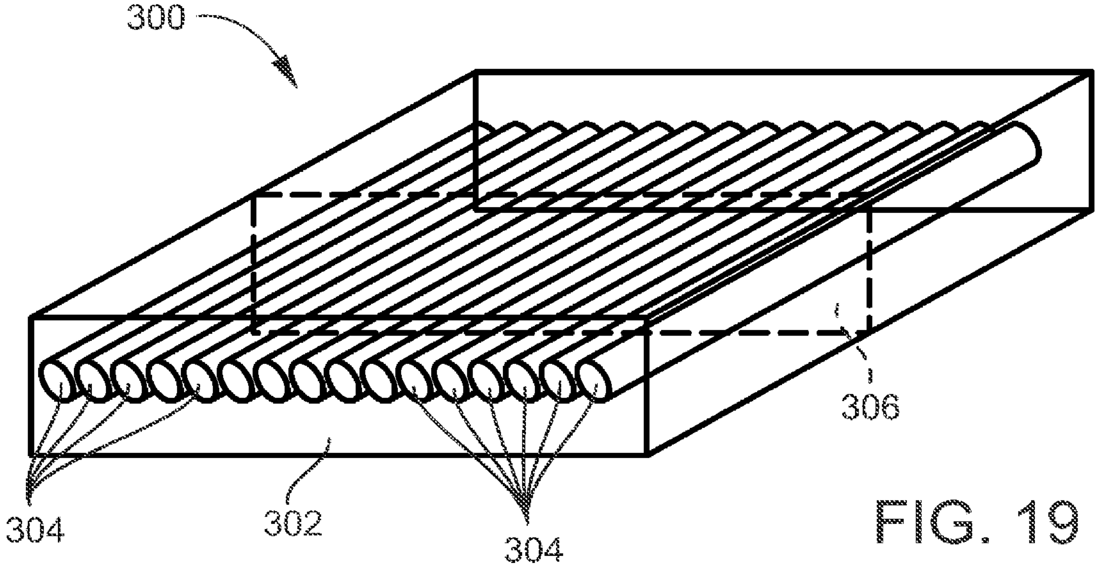
FIG. 19 is a view of a filter element of the carbon-based radio frequency (RF) filter of FIG. 18.
Figure 20:
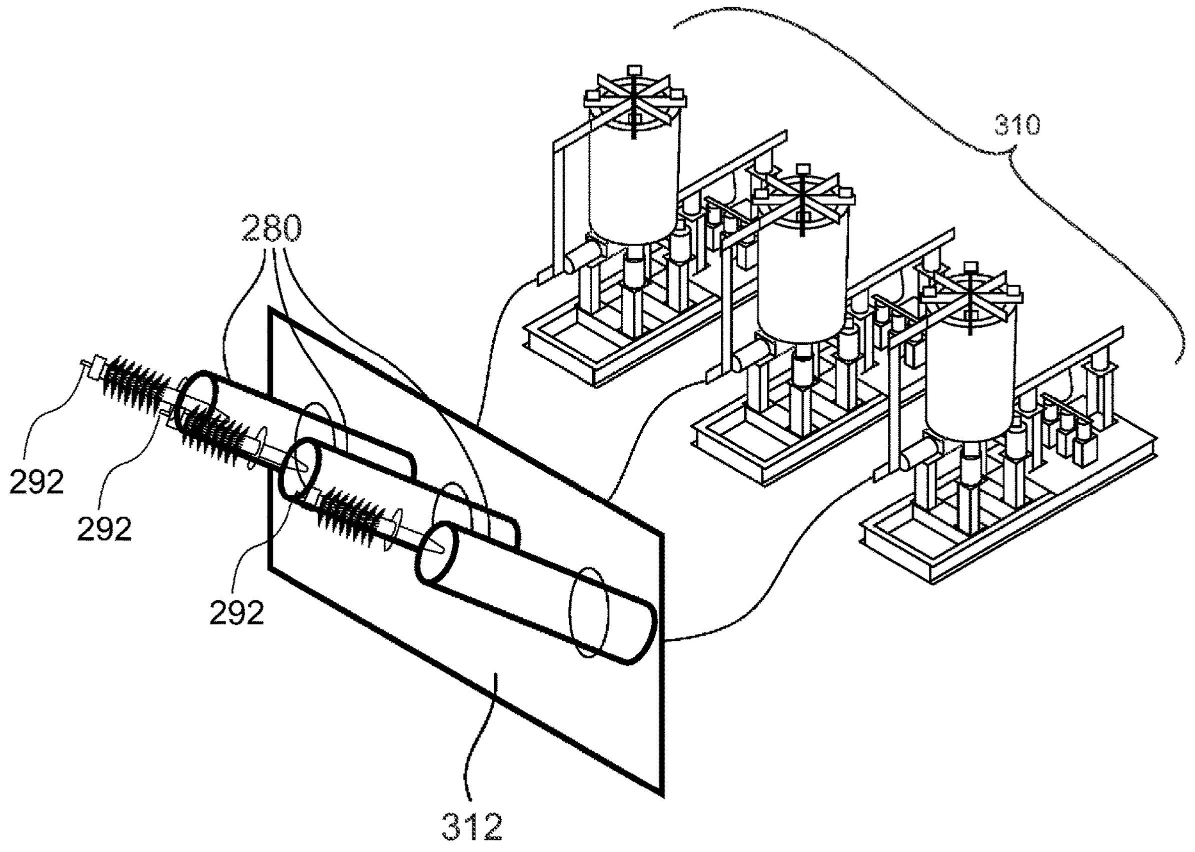
FIG. 20 is a perspective view of an application of a filter element of a carbon-based radio frequency (RF) filter according to FIGS. 18 and 19.

Referring now to FIGS. 18, 19 and 20, the use of carbon and carbon-containing materials for the purposes of absorbing and/or removing radio frequency ("RF") energy from wires, cables, conduits, pipes, electrical conductors or other metallic fixtures. The RF energy can come from a High-Altitude Electromagnetic Pulse ("HEMP" or "EMP") that is absorbed and conducted along conductive element, energy generated with an electronic device that is directly connected to a conductive element such as a wire, power conductor, or utility feeder commonly known as an Intentional Electromagnetic Interference ("IEMI") device, or energy that is absorbed and conducted along a conductive and/or metallic element from an IEMI device that is connected to an antenna that radiates IEMI energy so that a wire, cable, conduit, pipe, electrical conductor, or metallic fixture absorbs and conducts this potentially harmful energy.

A carbon RF reduces conducted RF energy on a conductor, whether directly superimposed on the conductor, or whether superimposed onto a conductor through free-space or other material. This carbon may be CCR, graphite, coke breeze, PET coke, calcined coke, or other carbon-containing material that is capable of absorbing RF energy. The carbon containing material may be configured in mats or sheets, it may be in granular form in various particle sizes, or it may be in any other form, provided it has the RF absorbing characteristics. Embedding a conductor in carbon-containing materials can act as an absorber of RF energy that travels along the conductor. This effect is such that a conductor thus configured acts as a filter, allowing the passage of intended low-frequency signals, such as electrical power in alternating current, or direct current forms, or low frequency signals such as those used in some sensors and actuator controls.

One specific embodiment of this feature is in electrical power into an RF shielded structure (this can include a HEMP shielded structure, an IEMI shielded structure, or a combination of both or any other structure that is designed to limit the incursion of RF energy into a protected/shielded space. A structure that has other applications (such as an "All-Hazard Total Protective Structure") may also be RF shielded. Such a filter constructed in this way can be effective at different voltages, even voltages commonly referred to in electrical utility terms as "Low-Voltage", "Medium-Voltage" or "High-Voltage" intended to refer to voltages from 0 Volts to voltages measured in the hundreds of thousands of volts or higher.

For example, a power line that is run through a carbon RF filter of this type will pass 60 Hz AC or Direct Current but will significantly reduce RF energy that may be intentionally or unintentionally travelling along the same conductor. This differs significantly from a typical RF filter that may be comprised of inductors and capacitors as commercially available because these filters will generally have some loss associated with their use. The carbon RF filter is a significant improvement over conventional filter technologies in that losses are eliminated other than those that are typically experienced in the same conductor not embedded in carbon-containing material for the purposes of carrying electrical current.

The filter may or may not be constructed so that conductors pass into a metallic enclosure (with proper insulation and electrical stress protection on the conductor entry and exit) that holds carbon containing material. In the event of an electrical fault, any current will be safely contained within the enclosure and safely allow for the "fault" to be cleared by typically used electrical equipment, such as fuses or breakers or other protection means. This type of shielding is required for conductors above a certain voltage level.

Conductors embedded in carbon may include those typically available from electrical conductor vendors, or it may be a specially designed conductor that is specially insulated inside of a nylon or PVC (or other electrical insulating material) tube. The use of SF6 (sulfur hexafluoride) or dry air or other material or gas may be used to create an insulating barrier inside of a non-conductive enclosure or pipe that allows for a metallic busbar (such as copper) to be embedded in carbon-containing material. The conductors, when appropriate as dictated by the electrical code, may be embedded directly in carbon-containing material with no specific enclosure.

The carbon containing material may be in a mat or sheet form and may be wrapped around individual conductors to provide RF absorbing/filtering characteristics.

As shown in FIG. 18 an RF filter 280 includes steel or other ferrous or non-ferrous conductive pipe 282 enclosed on both ends by steel or non-conductive threaded end caps 284, 286. The end caps 284, 286 include openings through which extend respective bushings 288, 290, which may be electrical stress-protected connectors. The bushings 288, 290 connect with an electrical conductor 292, such as an electrically-conductive cable that extends through the length of the filter 280. The conductor 292 may be insulated, or may be a dielectric/insulating insert 294 with the conductor 292 extending through the insert. The pipe 282 defines a void, and the void is filled with carbon-containing materials, as described above, to provide high-frequency filtering. Multiple elements can be arranged to act as RF filters for 3-phase power, DC power from photovoltaics as examples, but not the only possible applications. The conductor 292 can be or include electrically-conductive cable as described above, and can be or include copper pipe, copper busbar, or rod, or other conductive material or structure.

FIG. 19 illustrates another possible RF filter 300 that utilizes a metal box 302 in which an array of conductors 304 is positioned. The exterior of the box 302 is provided with an RF attenuating barrier 306, such as a mesh as described in this application. The box is filled with a carbon-containing RF absorbing material such as coke breeze or one of the other carbon-based materials described above.

Referring now to FIG. 20, the above-described RF filters 280, and 300, not shown, can be used for applications like electric power substation 310 or other facility where multiple conductors 292 of respective multiple spaced-apart RF filters 280 may pass from an unshielded area through a shield barrier 312 to a shielded area of the substation 310, and applications (such as high-speed protective relays) that may not be compatible with conventional filters. Grounding shields from the cables would be removed for the portion of the conductors that pass through the carbon containing absorbing material. However, the carbon RF filter 180 or 200 is utilized it will be configured so that one end is outside of the shielded environment, and the other end is inside the shielded environment, as shown in FIG. 20. Inside of the RF shielded environment, other protective devices, such as metal-oxide varistors may be employed to reduce any remaining RF artifacts.

Transient suppression devices can take on many forms from arc contacts, to filters, to solid state semiconductor devices. Discrete semiconductor transient suppression devices such as the Metal-oxide Varistor, or ("MOV"), are by far the most common as they are available in a variety of energy absorbing and voltage ratings making it possible to exercise tight control over unwanted and potentially destructive transients or over voltage spikes. With higher frequency RF artifacts removed, MOV's may be effectively employed.

Often when high-frequency artifacts are present, an MOV does not act fast enough to protect against conducted RF energy that may be damaging. With the higher frequency artifacts removed, the "rise time" of any RF energy will be significantly less, allowing for conventional and/or less expensive MOV's that have a slower rise-time response to be used to provide more effective protection to a conductor in a shielded environment.

Figure 21:
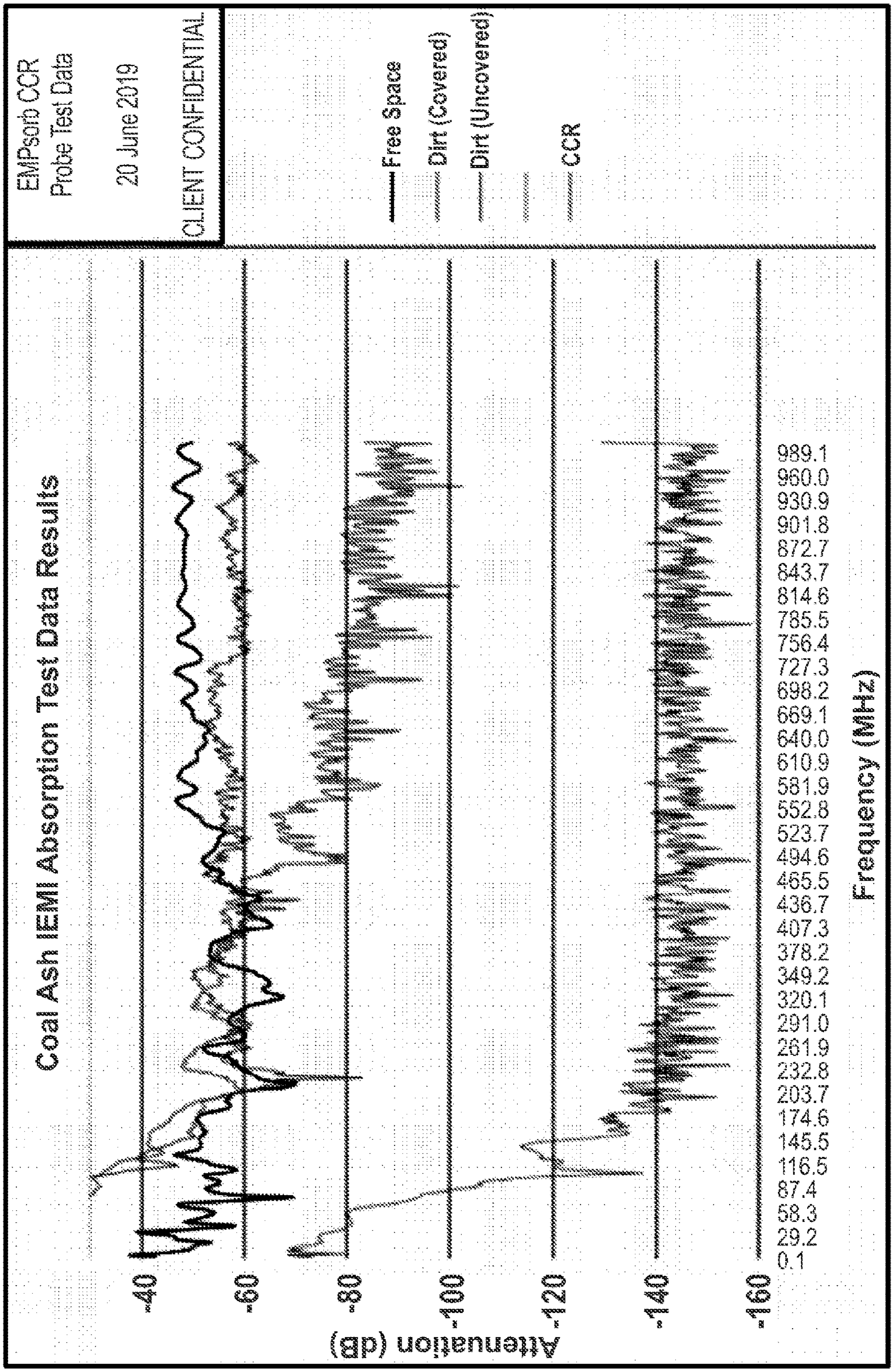
FIG. 21 is a table showing Coal Ash IEMI Absorption test data results.
Figure 22:
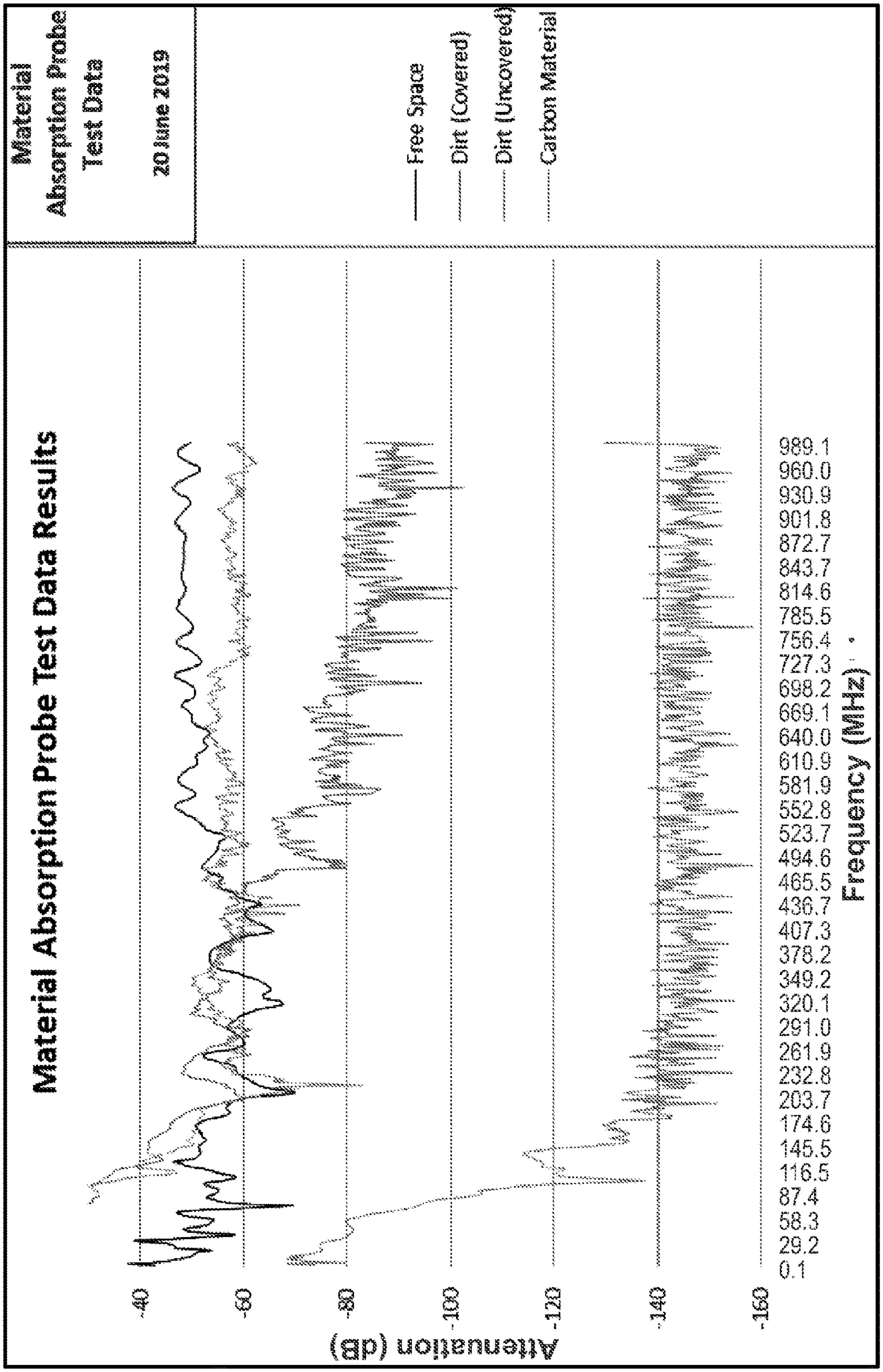
FIG. 22 is a table showing Material Absorption probe test data results.

FIGS. 21 and 22 are tables showing Coal Ash IEMI absorption test data results and Material Absorption probe test data results, respectively.

Referring now to FIGS. 23, 24, 25 and 26, alternatives to the fully enclosed CCR structures disclosed above are explained. In some circumstances it may be impractical to enclose large facilities fully with vast quantities of CCR. In such circumstances large facilities, for example, utility power stations, military structures and similar facilities can be positioned within an open berm structure. The berm structure can provide protection against low level, low angle IEMI by deflecting the IEMI up and over the facilities within the open berm structure.

For example, a berm 340 is shown in cross-section and has an isosceles or three sides equal trapezoid shape, with a relatively wide base 342, opposed inner and outer sloped walls 344, 346 surmounted by a relatively narrow top 348. The top 348 may be configured as a roadbed along which security or service vehicles may travel. The volume of the berm 340 is comprised of compacted CCR and other EMP absorbing materials, as described above. The berm may include a security fence. The base 342 of the berm 340 may be protected using the enclosure techniques described above, including the user of coke breeze materials, vapor barriers, steel and concrete.

Figure 23:
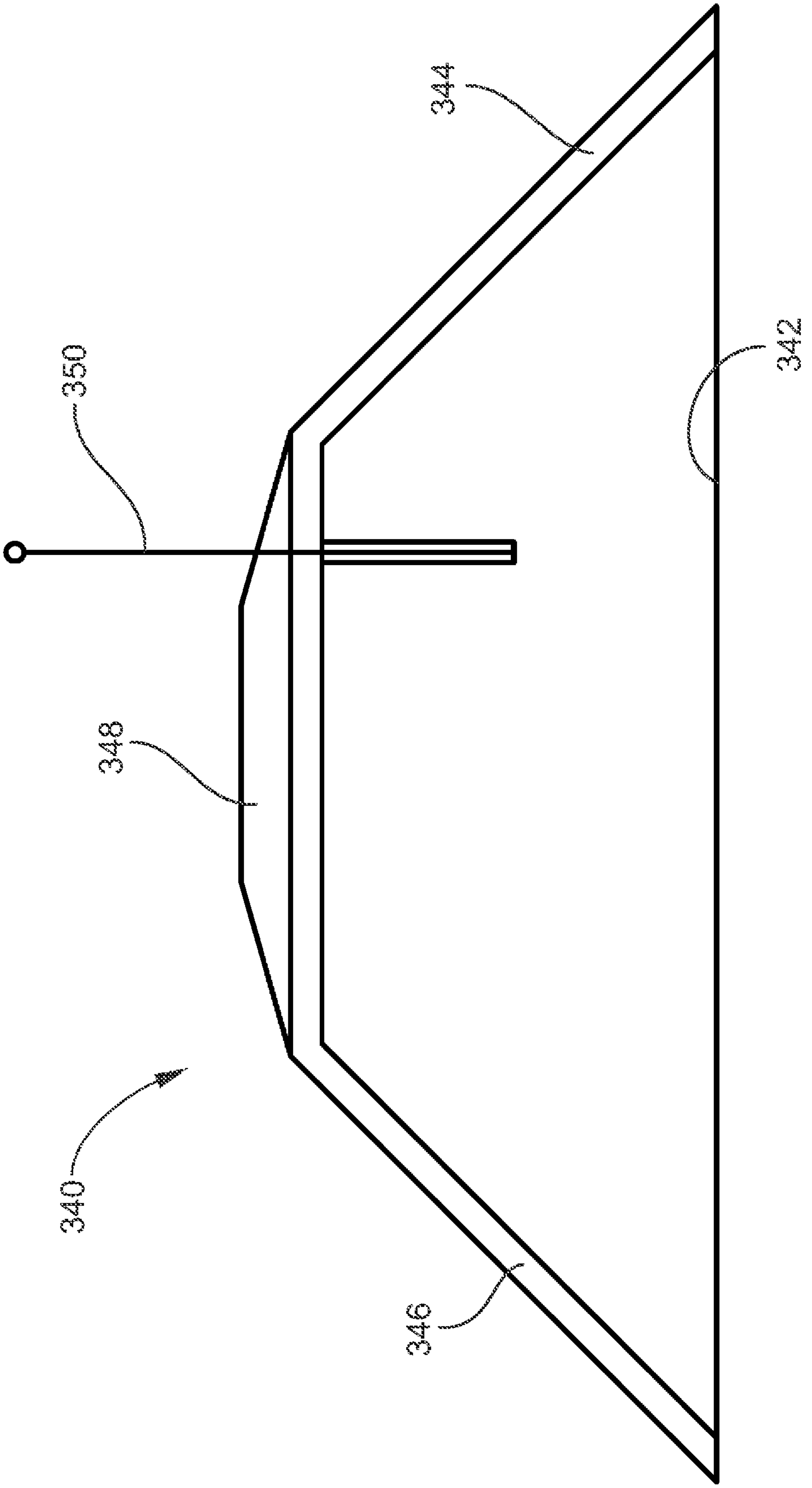
FIG. 23 is a vertical cross-section of an elongated IEMI protective berm incorporating coal combustion residuals.
Figure 24:
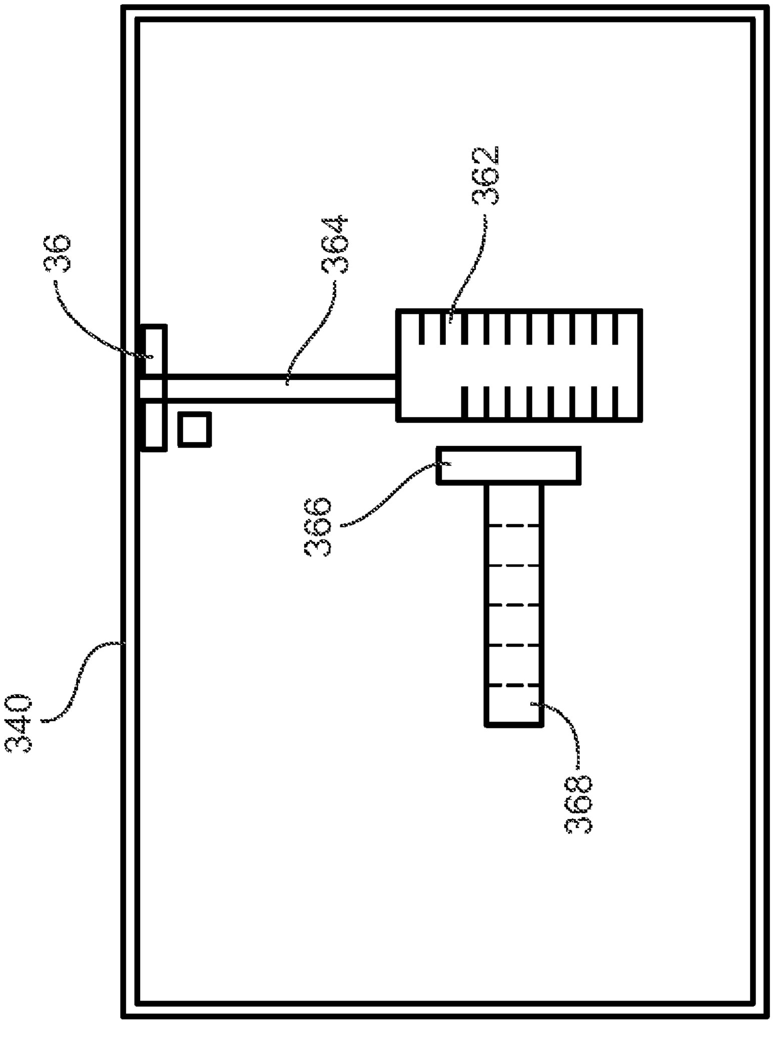
FIG. 24 is a top plan view of a secure compound surrounded by an elongated IEMI protective berm according to FIG. 23.

Referring to FIG. 24 is a top plan view of a secure compound surrounded by the elongated EMP protective berm 340 according to FIG. 23. The berm 340 defines a secure perimeter with an ingress/egress 360. Vehicles access a parking lot 362 via a driveway 364. The compound can include any desired structures, for example offices 366 and warehouses 368. The height of the perimeter berm 340 is determined by the height of the structures within the enclosure of the berm 340. Ideally, the height of the berm 340 will be at least as high as or higher than the highest structure within the perimeter.

Figure 25:
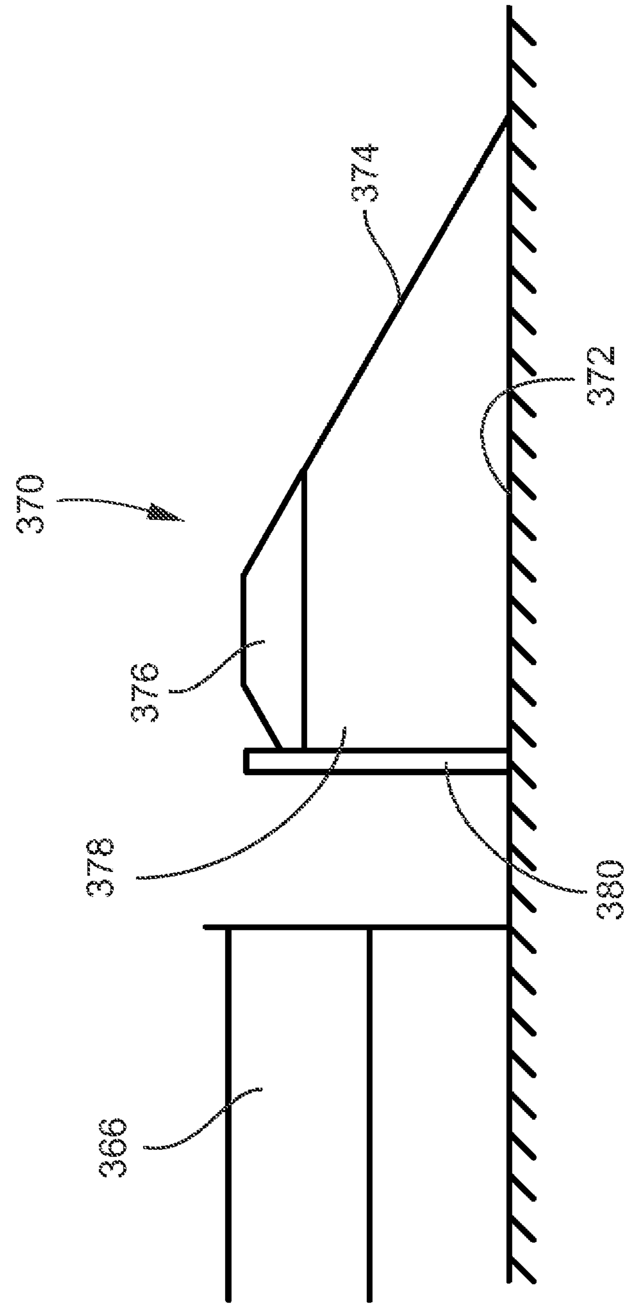
FIG. 25 is a partial vertical cross-section of a secure compound surrounded by an elongated IEMI protective berm according to another embodiment.

FIG. 25 is a partial vertical cross-section of a secure compound surrounded by an elongated EMP protective berm 370 according to an alternative embodiment having a right isosceles shape with a wide base 372, outwardly facing, protective sloping side 374 surmounted by a relatively narrow top 376. The top 376 may serve as a roadbed. The inner wall 378 is vertical and thus occupies less interior space than other designs. The vertical inner wall 378 may be supported by a separate barrier wall 380. As with the other berm embodiments, the volume of the berm 370 is comprised of compacted CCR and other EMP absorbing materials, as described above.

Figure 26:
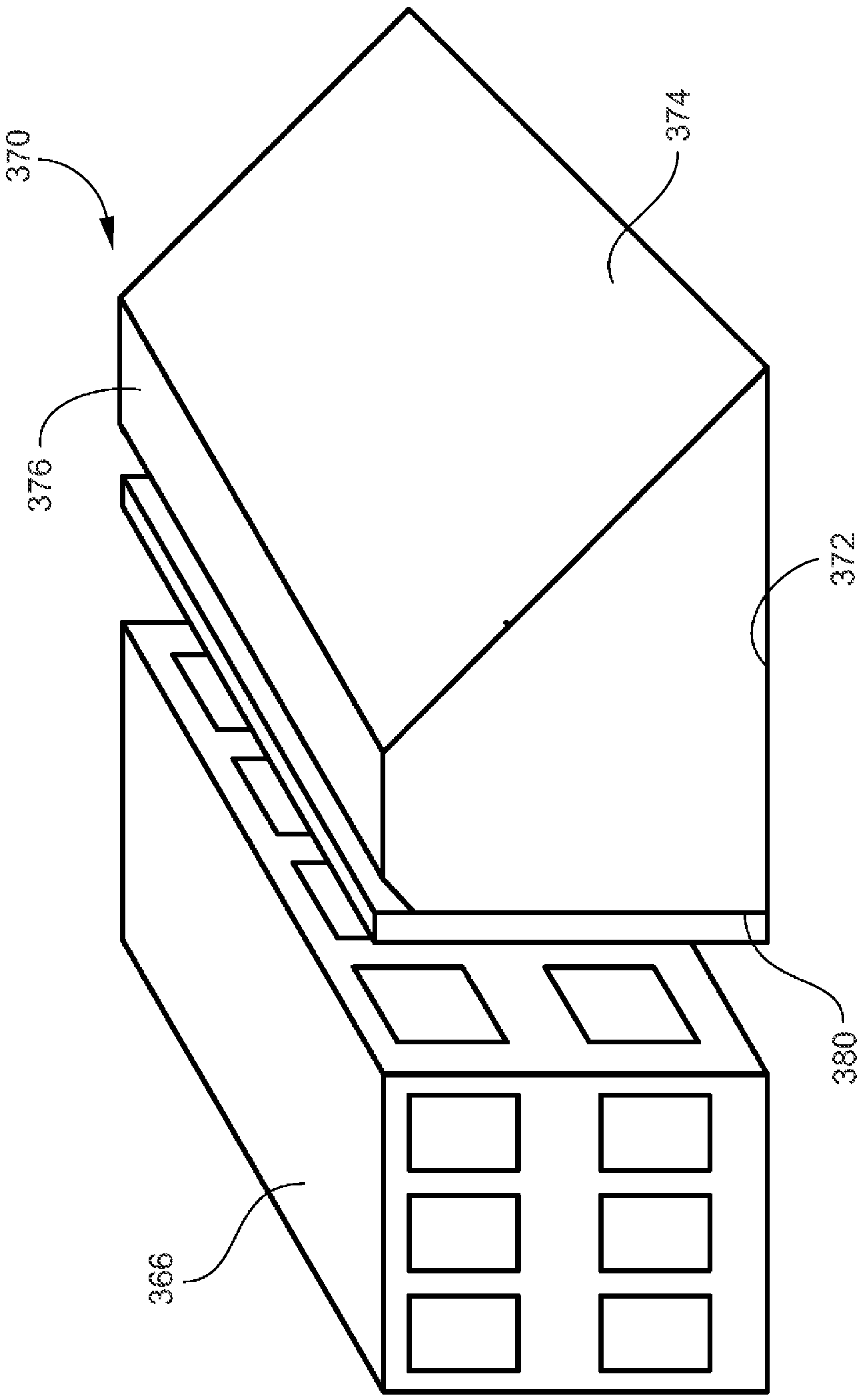
FIG. 26 is a perspective view of the secure compound of FIG. 25.

FIG. 26 is a perspective view of the secure compound and berm 370 of FIG. 25. An electromagnetic emission shield for protecting a coal combustion residue facility according to the invention has been described with reference to specific embodiments and examples. Various details of the invention may be changed without departing from the scope of the invention.

Figure 27:
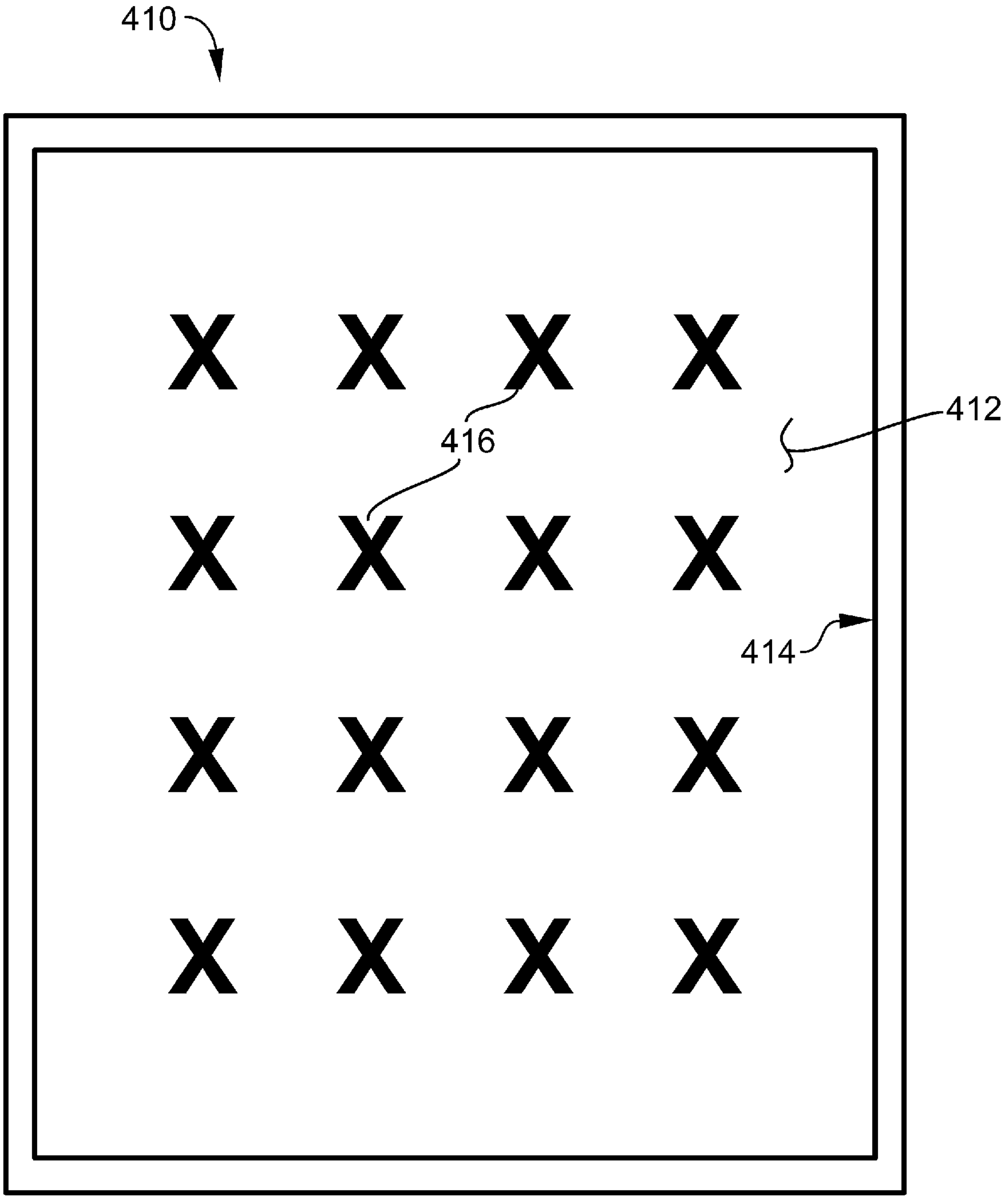
FIG. 27 is top plan view of an enclosure panel according to one embodiment of the invention showing horizontally-placed steel components before the concrete portion of the enclosure panel is placed into the panel enclosure.

Referring now to FIGS. 27-35, corresponding to and incorporated herein from FIGS. 1-9 of priority application Ser. No. 16/711,581, now U.S. Pat. No. 10,765,045, FIG. 27 is a plan view of an EMP protective composite enclosure panel 410 according to one embodiment of the invention. The casting bed 412 can be a sheet of steel that will form an integral part of a composite wall panel system formed of a number of enclosure panels 410. FIG. 27 shows the horizontally placed steel components before the concrete component of the enclosure panel 410 is poured. Steel members 414, preferably C-channels, are attached to the perimeter of the steel sheet 412 as shown. The steel members 414 along with the steel sheet 412 are used to permanently attach the enclosure panels 410 together once the walls fabricated from the panels 410 are tilted up to their final location as described further below. The enclosure panels 410 have the added benefit that the C-channel steel members 414 can be used as the edge form for the concrete which will be poured into the enclosure panel 410.

Other types of steel members such as angles can be used or in heavy structural loading conditions, H-piles or wide flange beams are among other types that can be used. The number, thickness, type and size of steel member and their direction in the panels can vary depending on the design requirements.

In light structural loading conditions, the sides of the concrete in the panel 410 can be a temporary wood or steel forming system, and the welded components can be welded to the steel sheet 412 such that no side steel member 414 would be used in this design application. Nelson studs 416 can be attached to the inner side of the steel sheet 412 to form a structural connection for the concrete.

Figure 28:
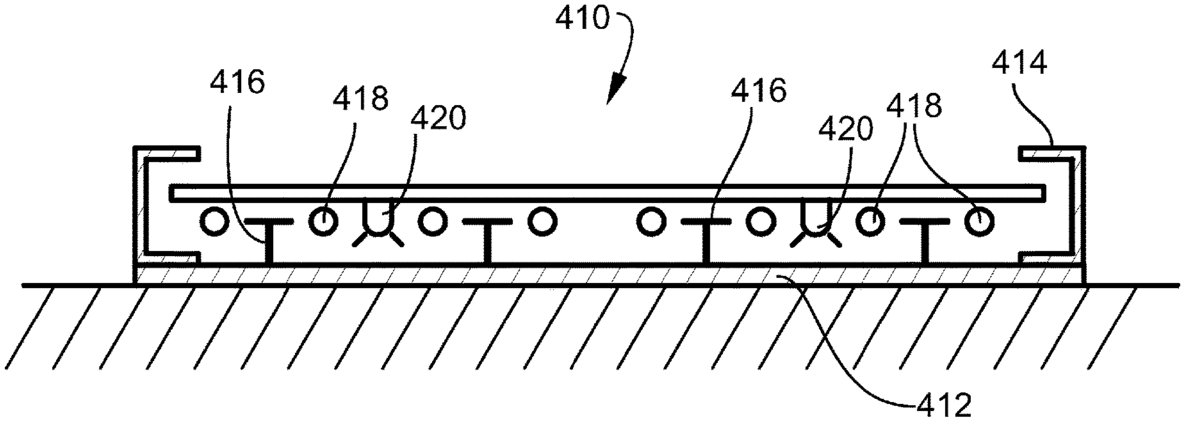
FIG. 28 is a cross-section of the horizontally placed steel components of the enclosure panel before the concrete is poured.
Figure 29:
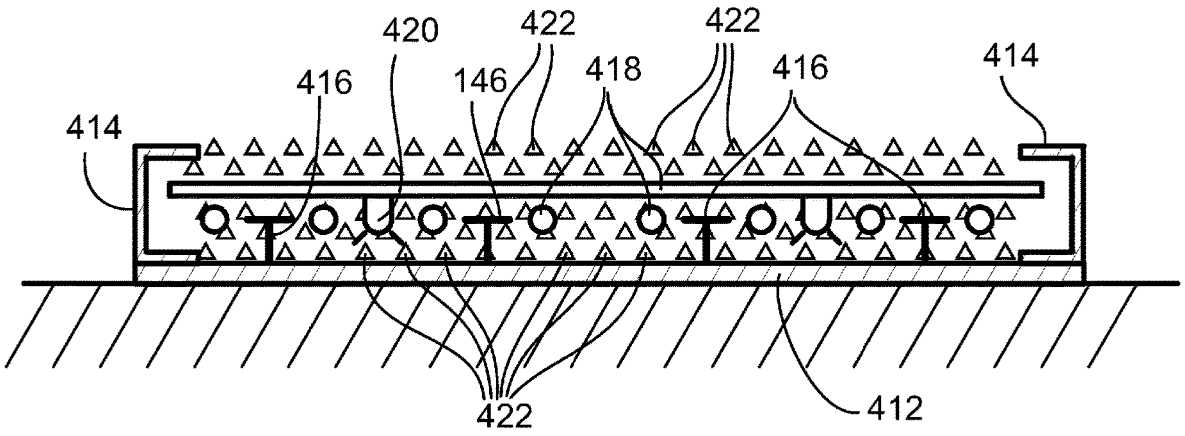
FIG. 29 is a plan view of the enclosure panel.

FIG. 28, shows a cross section of the horizontally placed steel components of the enclosure panel 410 before the concrete is placed being supported by "Earth" or the building's slab on grade. Concrete reinforcing members 418, also termed and referenced herein bars 418, are placed in the panel 410 as a grid before the concrete is poured. The reinforcing bars in 418 structural load bearing panels 410 can be placed in both directions. Structural weld wire fabric (WWF) may also be used in lieu of the reinforcing bars 418 in some structural design applications. Tilt-up lifting inserts 420 and wall bracing inserts to temporarily hold the panels in place may be placed in the panels to facilitate the tilt-up process.

Once the lifting and bracing inserts 420 and reinforcing bars 418 are installed, if not integrated into the enclosure panel 410, concrete 422 is poured into the void defined by the perimeter C-channel steel members 414, vibrated to eliminate air and densify the concrete, and smoothed to a suitable surface finish. The concrete mix designs for the concrete used in the composite panels 410 will vary depending on the level of EMP protection required by the end user, the structural load that will be applied to the panel 410 in its intended design use, and the structural qualities and sizes of the steel components. As stated above, EMP protection is provided by the combination of conduction, ab sorption and reflection properties of materials.

A concrete mix design which includes carbon-based materials, some previously-patented concrete mix designs which are referenced in this application or a concrete mix design with similar capabilities can provide EMP protection based on the absorption capabilities of the carbon in the concrete and the conductivity of the steel fibers. A concrete mix design that includes steel fibers will add conduction capabilities to the concrete which protects against EMP. Contingent on the thickness and type of the steel components in the composite panel 410's design, the EMP protection capabilities of the concrete can be redundant features of the composite panel 410, or they can be primary features if the concrete 422 is conductive with steel fibers in the concrete portion of the composite panels and includes carbon in the concrete mix design for absorption capabilities as described in this application.

If the steel is of a required thickness, the concrete 422 can be a structural component without carbon or steel fibers offering very limited EMP protection itself, but with the EMP protection being provided by the steel components when installed in a continuous welded or a structurally mechanically connected fashion as detailed below in this application.

Once the concrete 422 has cured to the point obtaining the required structural strength, the panels will be tilted-up and temporarily braced until the other components of the structure are assembled and/or constructed, at which time the panels 410 will be permanently connected and secured in place with structural components of the facility. The steel components of the composite panels 410 can be placed on the interior or exterior side of the side of the structure.

Figure 30:
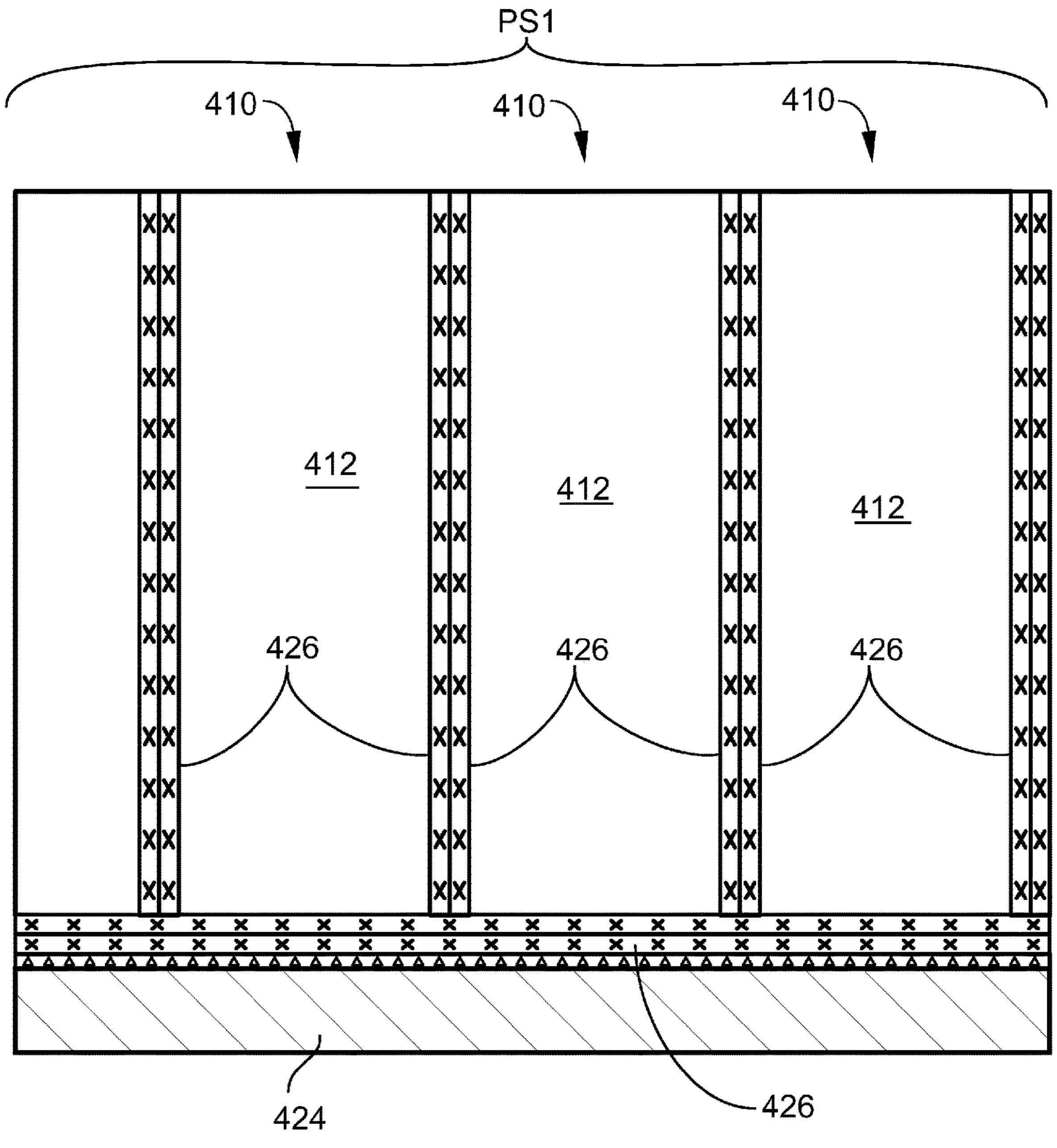
FIG. 30 is an elevation view of an EMP protective composite wall panel system formed of a series of enclosure panels according to one embodiment of the invention.

FIG. 30 shows the elevation view of the EMP protective composite wall panel system PS1 formed of a series of panels 410 that are erected and connected side-by-side. In the embodiment of FIG. 30, the panels 410 have the steel sheet casting bed 412 on the interior side of the structure and resting on a concrete foundation system 424. The composite panels 410 will be welded in a continuous fashion using an angle iron or other metal shape to connect the panel to the foundation which will have a metal structural component 426 that is designed and constructed as part of the foundation system which can work for both structural and EMP protection purposes.

A flat bar of steel 426 can be continuously welded to each panel 410 to create a solid metal connection which will allow for electrical/magnetic conductivity, shielding and absorption. EMP protective roof and floor systems will be described later in this application, which when taken in their entirety and connect to the panel system will provide several different options to provide a complete EMP protective system(s) for building structures using the composite panels 410 disclosed in this invention.

The EMP protective enclosure composite panels 410 can be used above grade, below grade or a mixture of both in a structure, both in a horizontal, vertical or angled position. One advantage of having the steel components of the panels 410 placed on the inside of a structure is that over several decades, if the steel needs to be repaired it can be easily accessed. If the steel is placed to the exterior and it is used above or below grade, the steel can be coated with corrosion protective materials in addition to architecturally design materials. The steel can also be galvanized on the exterior, if required, with the welding of the panels 410 taking place on the interior portion of the C-channel steel members 414, which can be painted, ungalvanized steel. If the concrete 422 is on the exterior side of the structure and is below grade, concrete protective liners can be used. Architectural form liners can be used when the end user specifies a more decorative finish, using a product as produced by Sika Greenstreak form liners.

FIG. 30 shows the panels 410 being placed in the vertical direction, but the panels 410 can be placed horizontally as well. In multi-level structures, panels 410 can be stacked on top of each other in a load-bearing fashion or supported by other structural components of the building, which allows the structural engineers and architects design flexibility.

Figure 31:
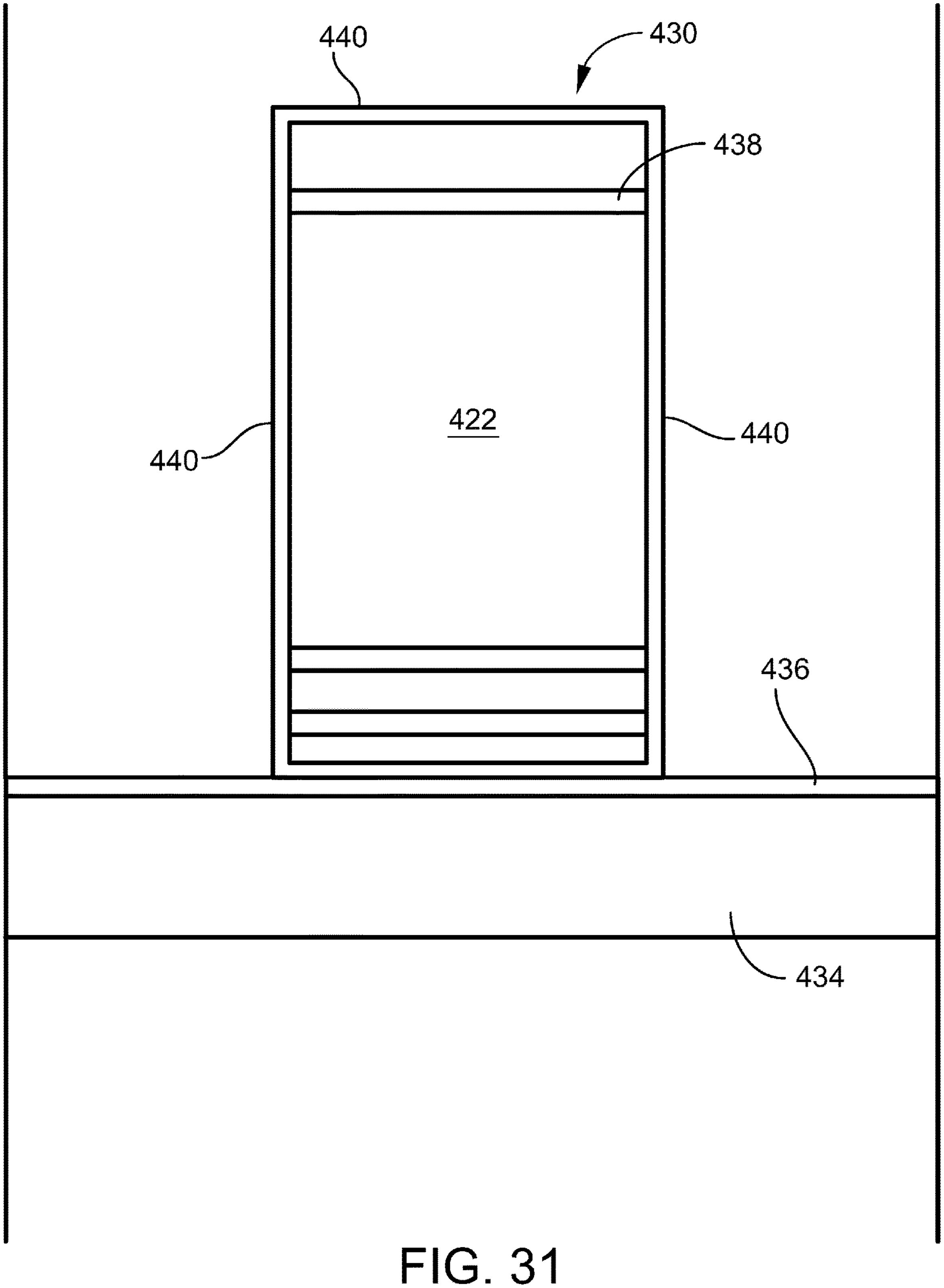
FIG. 31 shows an EMP protective composite panel with an interior side of concrete.

FIG. 31 shows an EMP protective composite panel 30 when the interior side is concrete 422. Embedded in the concrete 422 can be continuous metal flat bar located between the foundation 434, and the slab-on grade 436 at ground level. Another flat bar 438 at the roof level can be embedded in the concrete side of the panel 30 for welding of other EMP protective composite panels or other EMP protective features as described further below in this application.

Another option for the welding of other roof protective features is the top of the C channel steel member 440. The EMP protective concrete panel 30 can be welded to the foundation metal connection point 436 in a continuous fashion to the bottom C channel steel member 440. Other features described below will provide the required EMP protection from the negative EMP effects passing beneath the ground, if not protected against, will enter the structure from its bottom side. The steel front side of the composite panel 410 that is placed on the exterior of the building may be placed under carbon-containing materials such as coke breeze, coal combustion residuals (CCR), soil or other materials, or exposed to the outdoors. The optional steel protective coatings addressed above will allow for corrosion protection in unfavorable climate conditions, high moisture content materials, salt air, or the CCR which may have a corrosive pH balance.

The above described method of using tilt-up construction is not intended to limit the means and methods of construction with which the enclosure panels may be constructed. The advantage of tilt-up construction is that the cost of transporting the weight of the concrete portion of the panel system is eliminated, in that ready-mix concrete will be either be batched on-site or purchased from a local ready-mix concrete supplier. In some instances, for an expedited construction project, it may be optimal to fabricate the panels in their entirety off-site and erect and secure the enclosure panels system together once the panels are delivered to the building site. Another option is to use the metal sheet portion of the enclosure panel's composite panel system as one side of a poured-in-place concrete form and place the ready-mixed concrete into the panels in a vertical position with the concrete portion of the panel being constructed with concrete formwork.

In conditions where the EMP protective panel system is required to take increased loading or to protect against the possibility of negative kinetic impact forces, the system may be designed to use post-tensioning cables and/or sheet piling or combination sheet piling and beam, h-pile or pipe configuration products/steel-sheet-piling for a greater section modulus https://en.wikipedia.org/wiki/Section modulus for the enclosure panels.

With the fast pace of EMP weapons technology innovations and advancement, similar to Raytheon's CHAMP weapon system, it is anticipated that these advancements will occur not only for EMP weapons but also for Intentional Electromagnetic Interference (IEMI) weapons, which these enclosure panels can also protect against if considered during the design process. Another aspect of the invention included in this application, is the end user may want a multi-layered approach which will provide even greater protection from man-made IEMI and EMP events as they currently exist, or the ability to withstand greater negative forces as weapon systems advancements are introduced.

Figure 32:
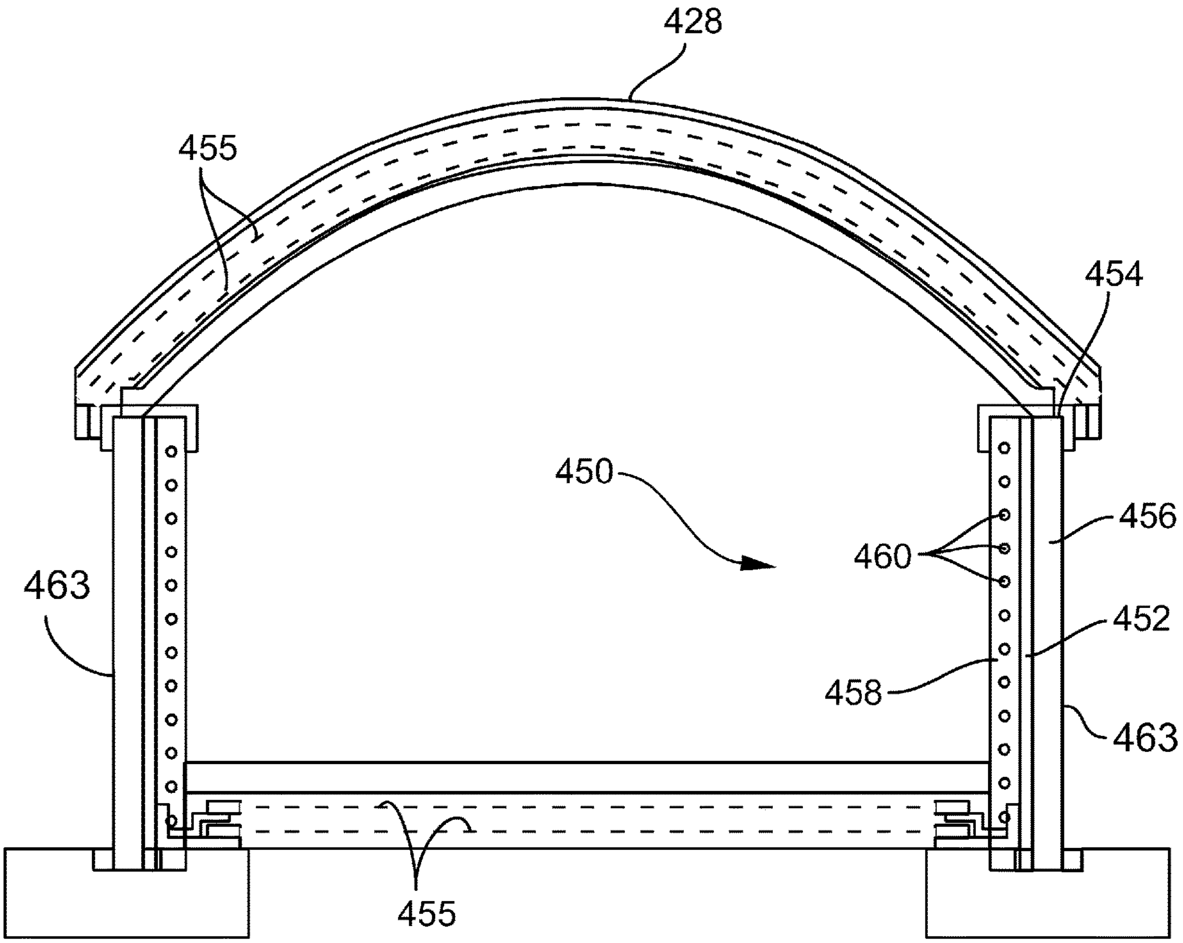
FIG. 32 is a partial side elevation of an EMP protected building utilizing an enclosure panel according to an embodiment of the invention.

Referring to FIG. 32, shown is a section cut of a structure having a roof 428, with layers 455, and an enclosure panel 450 according to another embodiment of the invention. The casting bed 452 can be a sheet of steel that will form an integral part of a composite wall panel system formed of a number of enclosure panels 450 formed of walls 63. Primary steel members 454, preferably C-channels, are attached to the perimeter of the steel sheet 452 as shown. The primary C-channel members 454 along with the steel sheet casting bed 452 are used to permanently attach the enclosure panels 450 together once the walls 463 fabricated from the panels 450 are tilted up to their final location. The primary C-channel members 454 of the enclosure panels 450 have the added benefit that the primary C-channel members 454 can be used as the edge form for the concrete which will be poured into the enclosure panel 450. The panel 450 has both an exterior concrete layer 456 and a secondary interior concrete layer 458, which includes reinforcing bars 460. The concrete layer 458 can be installed by a poured-in-place method or a shotcrete applied means and method. The concrete used in the secondary layer 458 can have many different mix designs. For additional protection, an end user may want the secondary concrete layer 458 mainly for the protection of the integrity of the steel casting bed 452 from unintentional or intentional damaging acts. The primary intended use of this secondary concrete layer 458 can also provide a conductive and absorptive concrete mix design so in the unlikely event that any negative electromagnetic energy enters the EMP protected area of the structure, this secondary concrete layer 458 would add one more layer of protection which would minimize the negative destructive impacts of the EMP energy.

Figure 33:
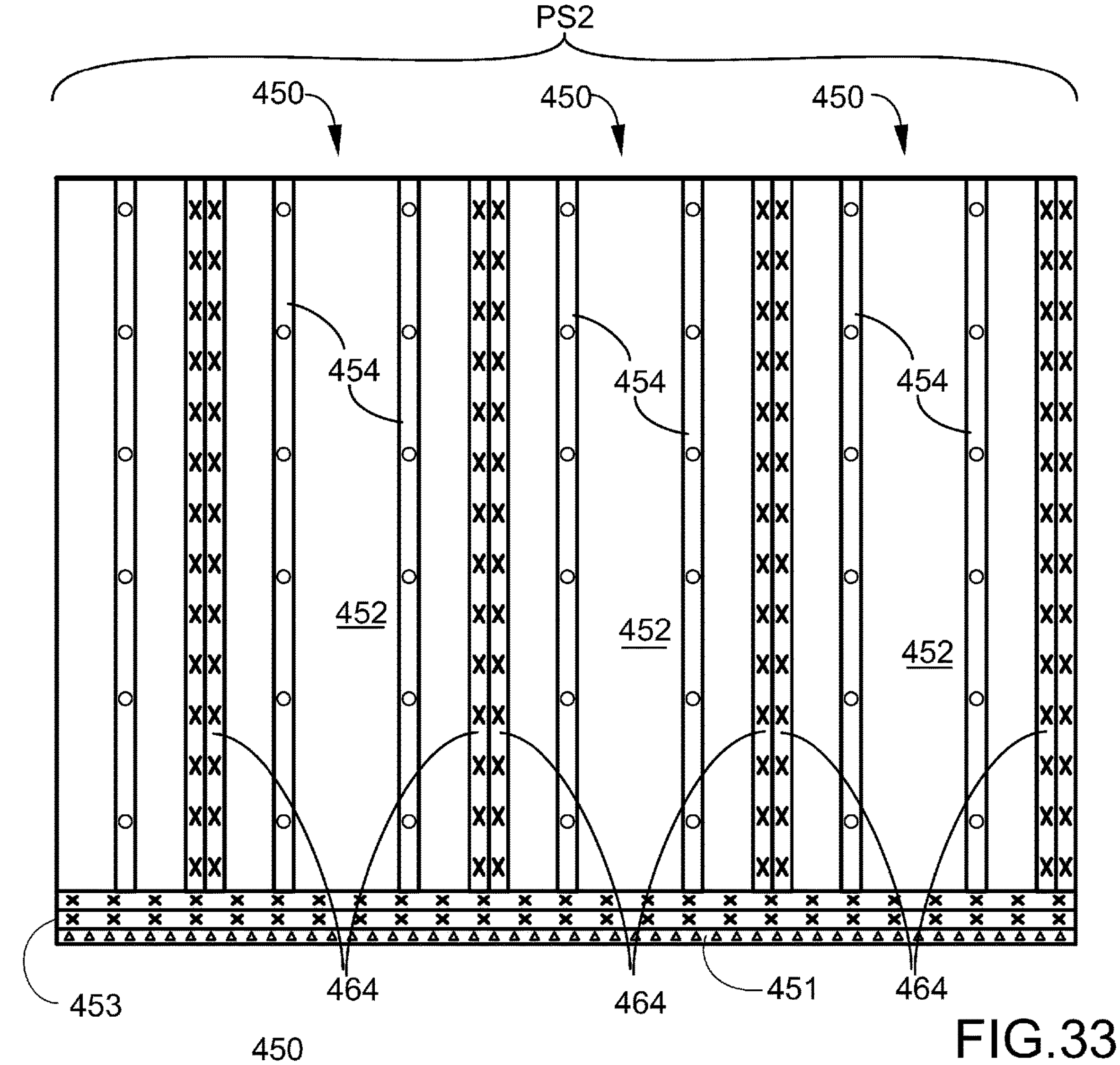
FIG. 33 is an elevation view of a series of connected enclosure panels according to an embodiment of the invention.

FIG. 33 shows the elevation view of the EMP protective composite wall panel system PS2 formed of a series of panels 450 that are erected and connected side-by-side in a manner the same as or similar to the connection method shown in FIG. 4, utilizing flat bars of steel 464 continuously welded to each panel 450 to create a solid metal connection which will allow for magnetic and electric field conductivity, shielding and absorption. The panel 450 is supported by a concrete foundation system 451 and a metal connection point 453.

Figure 34:
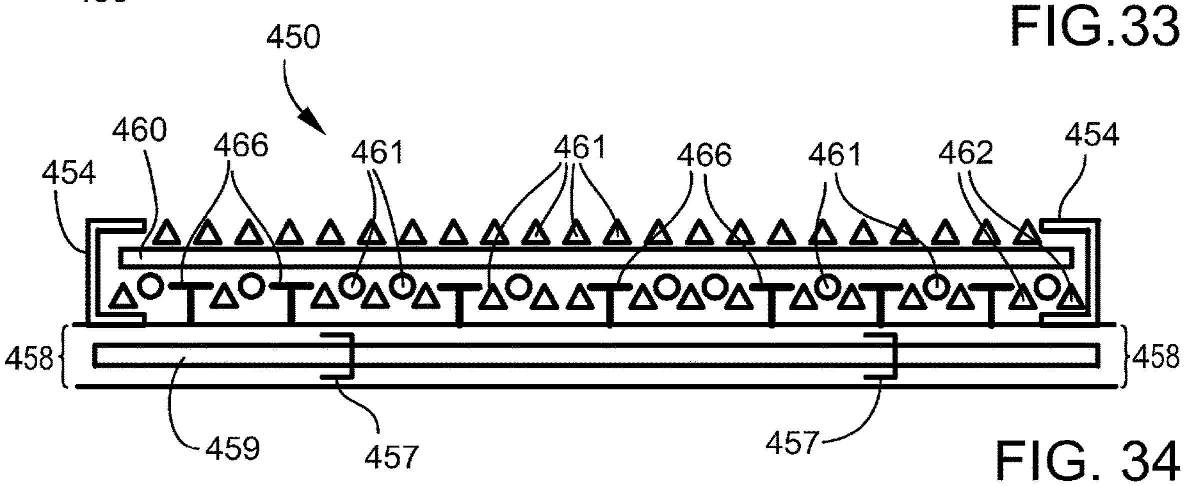
FIG. 34 is a cross-section of an alternative enclosure panel.

Referring to FIG. 34, the primary C-Channel members 454 of the panel 450 are provided with holes, not shown, through which to place steel reinforcing bars 460 to hold the concrete layer 462 in place. The panels 450 are tilted into place by lifting inserts 461.

Figure 35:
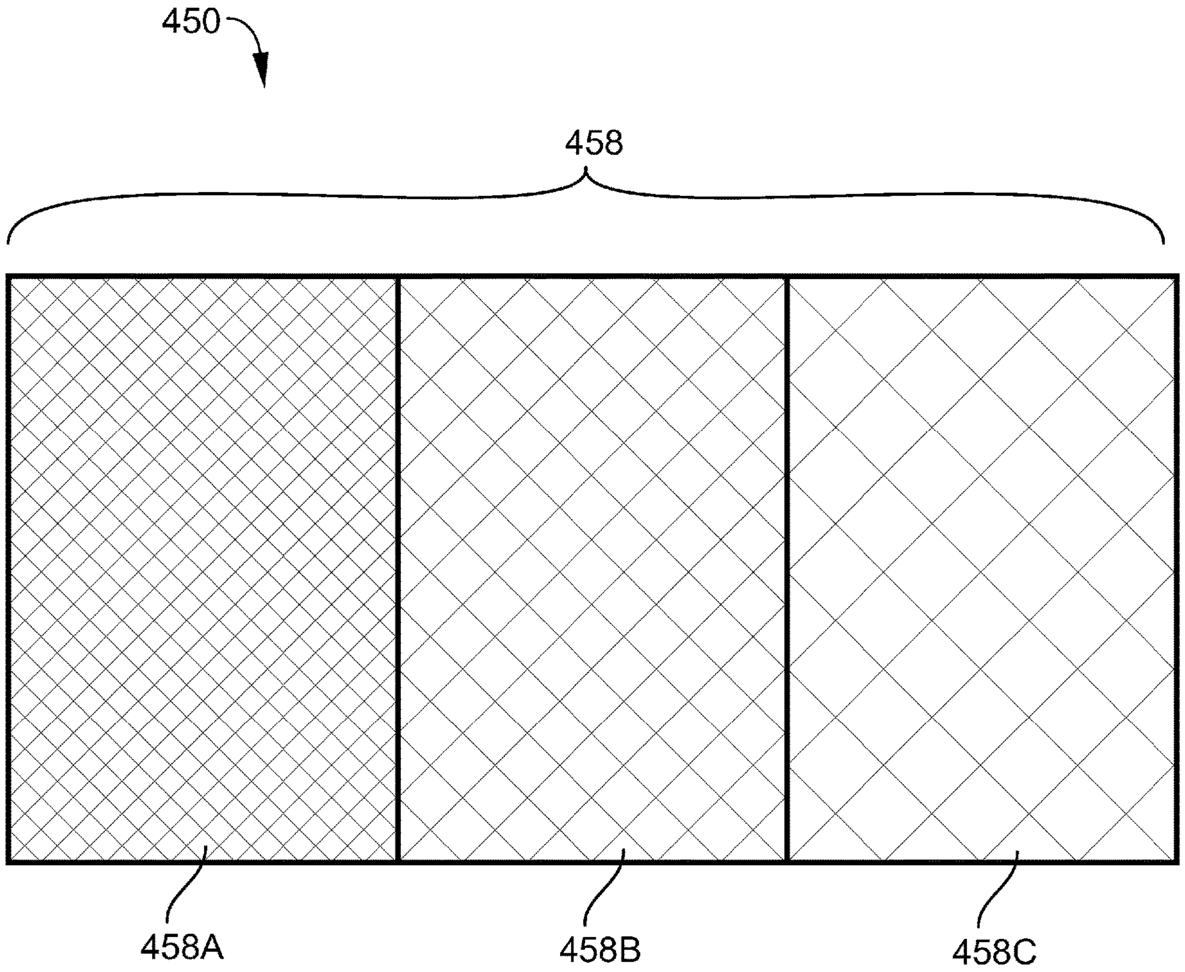
FIG. 35 is a fragmentary cross-section showing an interior concrete layer built up in separately-applied thicknesses.

To reduce the lateral pressure on the concrete formwork during the construction process, a secondary concrete layer 458 may be poured in multiple vertical lifts 458A, 458B and 458C, as shown in FIG. 35. The secondary concrete layer 458 encases secondary C-channel steel members 457 and steel reinforcing bars 459. If the shotcrete method is used for the secondary concrete layer 458, the shotcrete can be adhered to the metal sheet component using a chemical bonding agent and/or nelson studs 466 attached to the steel sheet 452 or reinforcing bars 460 as shown for the poured-in-place concrete method. See FIG. 34. In addition to specialized known concrete mix designs which can be used in the secondary concrete layer 458, Unistrut embeds or other types of concrete embeds used to increase the usefulness of the secondary pour can be incorporated into the design features.

Figure 36A:
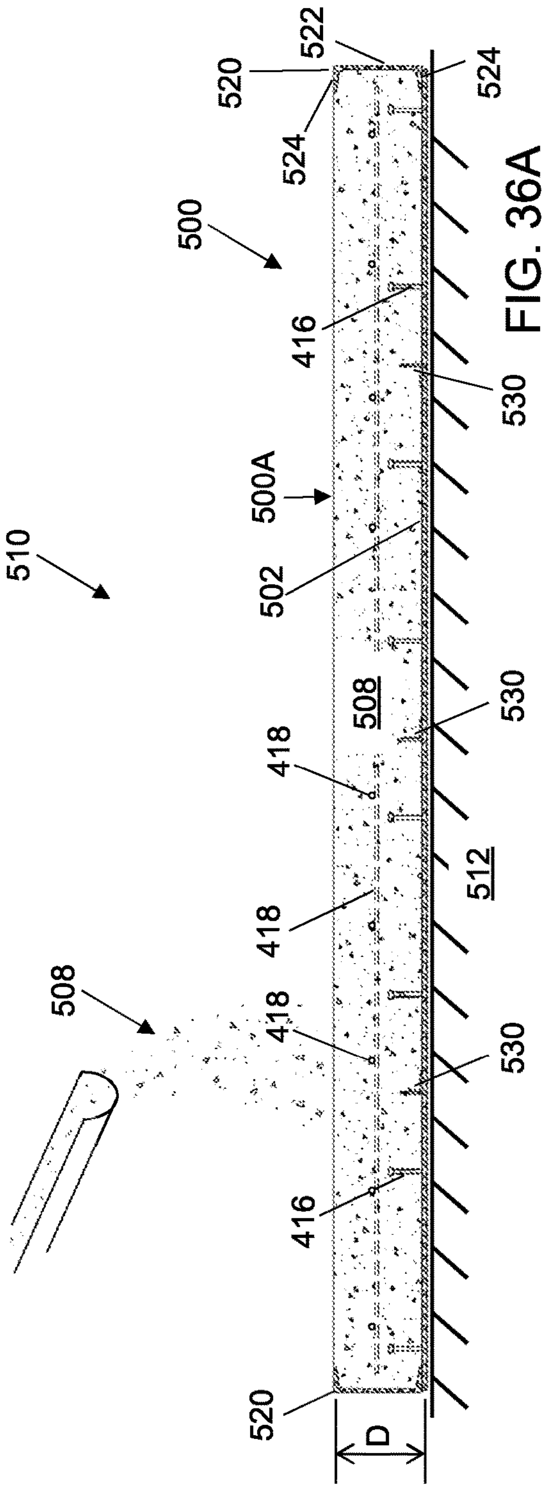
FIG. 36A is a cross-sectional view of a structural panel, according to a non-limiting embodiment, and an exemplary casting arrangement therefor, the illustrated panel shown as taken along the line 36A in FIG. 36C.
Figure 36C:
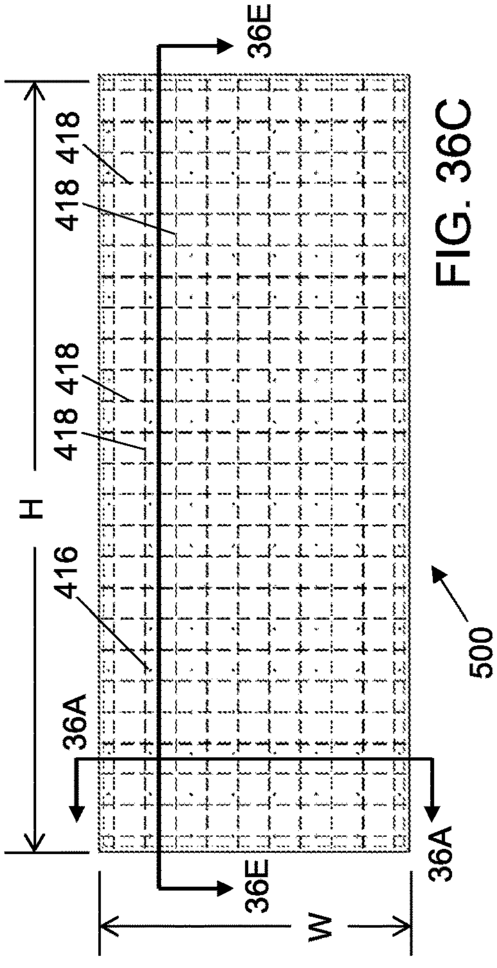
FIG. 36C is a plan view of the structural panel of FIG. 36A, with embedded components shown in dashed line.
Figure 36B:
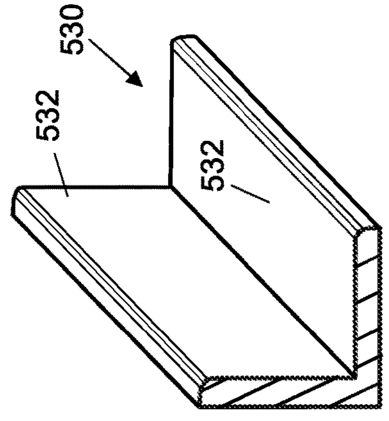
FIG. 36B is a cross-sectional isometric perspective view of an L-channel stiffener forming a part of the frame of the structural panel of FIG. 36A, according to at least one embodiment.

FIG. 36A is a cross-sectional view of a structural panel 500, constituting an EMP protective composite panel according to a non-limiting embodiment, for use as a wall section in a non-limiting example, having a backing sheet 502 and C-channel side members 520 forming a periphery along edges of the backing sheet. In the illustrated embodiment, the backing sheet 502 defines an uninterrupted ferrous back panel, for example made of steel, having an inner side 504 and an outer side 506 (FIG. 36E, 37D). The side members 520, which are shown in an enlarged cross sectional view in FIG. 36E, can be constructed of ferrous steel, and are formed as C-channel members in the illustrated embodiment having center webs 522 and opposing flanges 524 extending therefrom. Together, the side members 520 define an edge form of side members positioned around the uninterrupted ferrous back panel and define a perimeter. Together the backing sheet 502 and side members 520 serve as a rectangular steel frame or pan in the illustrated casting arrangement 510. The backing sheet 502 is horizontally placed on ground or other support surface 512 such as a building's floor slab on grade, with the center webs 522 of the C-channel side members 520 standing upward as walls serving together as a peripheral pan wall surrounding a volume that receives poured cementitious material 508. The flanges 524 of the C-channel side members 520 extend into the volume at its upper an lower margins. Each C-channel side member 520 can be affixed to the backing sheet 502, for example by filet welds 526 (FIG. 37D) along the lower backing-sheet facing edge of the web 522, with the lower flange 524 of the C-channel in contact with the inner facing surface 504 of the backing sheet 502 along the respective edge.

Upon filling of the volume of the pan, the depth (D) of which is defined by the web dimension of the side members 520, the inner facing surface 504 or side of the backing sheet 502 and the lower flanges 524 of the C-channel side members 520 are buried in the cementitious material 508. The upper flanges 524 of the C-channel side members 520 define a protective inward extending edge brim along the upper facing surface of the cured slab of cementitious material along the top of the volume opposite the inner facing surface of the backing sheet. The backing sheet 502 and lower flanges of the C-channel side members 520 together with the upper flanges define a protective lip cupping the peripheral edges of the slab and provides a continuous connection edge for the structural panel 500, for example by welding.

Directional terms such as upper and lower are used herein for descriptive convention without limiting the referenced structures to any particular orientation or disposition. These descriptions refer to both a casting arrangement 510, in which the backing sheet 502 is horizontally disposed and in which the terms upper and lower are intuitively defined, and to a fabricated structural panel 500 that can be tilted up, lifted and used in any orientation without ambiguating the terms used to describe its fabrication. In terms dissociated from directions and orientation, the upper or outer facing side of the cured slab can be termed the slab side 500A (FIG. 36A) of the structural panel, and the lower or opposite facing side of the structural panel can be termed the backing sheet side (500B) of the structural panel 500.

Studs 416 (FIGS. 36A, 36E) are welded to the inner surface of the backing sheet 502, extending into the volume within the perimeter of the pan to be embedded within and in intimate contact with the poured cementitious material 508, anchoring the backing sheet 502 to the cured slab thereof. A plurality of elongate and mutually interlocked reinforcing members 418 define a grid within the perimeter, the grid including longitudinally extending members 418 and laterally extending members 418. The grid is also embedded within and in intimate contact with the poured cementitious material 508, reinforcing the cured slab. Rebar, of ferrous metal, or similar interlocking elongate elements can serve as the reinforcing members 418.

Elongate stiffeners 530 are shown in FIG. 36A as in contact with, and optionally affixed to for example by filet or spot welding, the inner facing surface or side of the backing sheet 502 within the perimeter, serving with the backing sheet and side members 520 as part of the rectangular steel frame or pan. Multiple mutually parallel stiffeners 530, in at least one embodiment, span across the volume from one side member to an opposite parallel side member. An exemplary stiffener 530 is shown in an enlarged cross sectional view in FIG. 36B as an angle steel member, representing a stock material commercially available as "angle iron" or "continuous angle" steel, defining an L-channel member being an elongate unitary item of contiguous material having two elongate generally planar strips, termed legs, arranged at a right angle. Elongate stiffeners can also be formed as C-channel members, for example of same or similar stock and description as the side members 520. Furthermore, Elongate stiffeners can also be formed as I-beams referenced as stiffeners 520*i* in FIG. 36F, and as T-beams referenced as stiffeners 520T. Other stiffener constructions are within the scope of these descriptions. For example, steel members with sections in two-dimensions transvers to the longitudinal extension axis of a elongate columnar form can provide stiffening.

The stiffeners 530 can be of any preferred length, and can extend in longitudinal and lateral directions, for example parallel to one or more peripheral edge of a structure panel and slab thereof, in various embodiments of structure panels within the scope of these descriptions. In the structural panel 500 of FIG. 36B, as in the structural panel 620 of FIG. 38D for an enlarged view thereof, one leg 532 of each serves as a base positioned along the inner facing surface or side of the backing sheet 502 to be buried in the poured cementitious material 508 and the other leg 532 stands upward into the volume of the pan to be embedded in the poured cementitious material 508.

In some implementations, the steel frame or pan is fabricated off site, delivered by truck, and laid onto a building's floor slab on grade in preparation for the cementitious material pour or application. The stiffeners 530 provide additional rigidity to the frame or pan, an advantage particularly beneficial during hoisting, loading, and unloading onto and off of trucks and other vehicles.

The frame or pan forms a shallow vessel of depth (D) into which cementitious material 508 is placed by pouring as illustrated in FIG. 36A or applied by a shotcrete approach. The cementitious material can be EMP protective with the addition of carbon-based material as part of the concrete mix design, and can provide a redundancy of EMP protection above that of the backing sheet 502 and other ferrous components (520, 418, 530, for example).

By framing the cured cementitious material slab with the ferrous side members 520, which remain affixed to the slab and a permanent part of the structural panel 500, structural panels can be welded together via their adjacent side members 520 and/or their adjacent backing sheet edges to construct a multi-panel structure, such as a wall, similar to that illustrated in FIG. 6 with reference to the three walls 44 welded together end-to-end to form a three-wall panel.

Figure 36D:
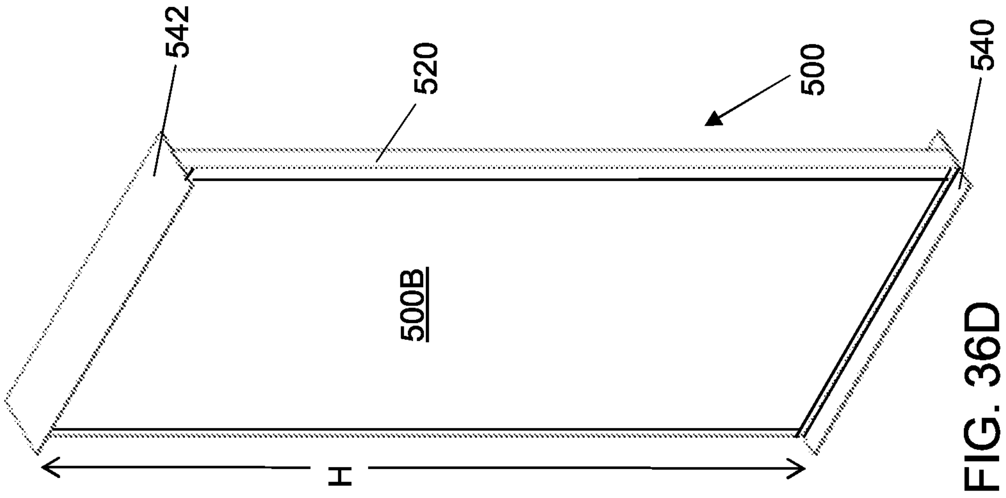
FIG. 36D is a perspective view of the structural panel of FIG. 36A, having affixed end plates according to at least one embodiment.
Figure 36E:
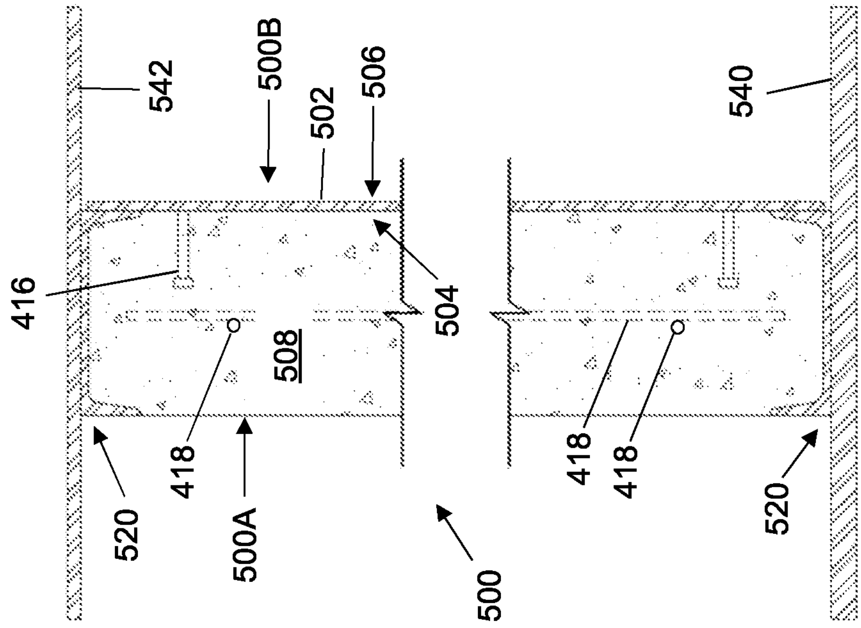
FIG. 36E is a cross-sectional view of longitudinal ends of the structural panel having affixed end plates as in FIG. 36D, according to a non-limiting embodiment, the illustrated panel shown as taken along the line 36E in FIG. 36C.
Figure 36F:
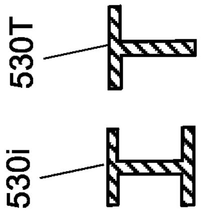
FIG. 36F is a cross-sectional view of an I-beam stiffener and a T-beam stiffener, each forming a part of the frame of the structural panel of FIG. 36A, in at least one embodiment each.

The structural panel 500 of FIG. 36A is shown in FIGS. 36D and 36E as having affixed end plates according to at least one embodiment. The structural panel is shown with references in FIG. 36C to longitudinal height (H) and lateral width (W), and in a vertical disposition in FIGS. 36D-36E, with the longer of its rectangular dimensions referenced as its height (H). In that context, a ferrous steel base plate 540 is shown affixed to the now lower of the side members 520, for example by filet welding. Similarly, a ferrous steel top plate 542 is shown affixed to the now higher of the side members 520, for example by filet welding. Structural panels can be welded together via their adjacent side members and/or their adjacent backing panel edges, as already described, and with adjacent ends of end plates, with reference to the base plate 540 and top plate 542, also welded, to construct a multi-panel structure.

In exemplary non-limiting examples of dimensions, a structural panel 500 according to these descriptions can have a height (H) of approximately twenty five feet, a width (W) of approximately ten feet, and a slab depth (D) of eight inches. The base plate 540 and top plate 542 in at least one embodiment are each approximately twenty four inches wide taken in the same dimension as the depth (D), and are respectively one inch and one-half inch thick. The backing sheet 502, and the side members 520 can be formed from A/36 steel. The backing sheet 502 can be approximately three-eights inch thick. The studs 416 can be spaced longitudinally and laterally at sixteen inches on center.

Figure 37A:
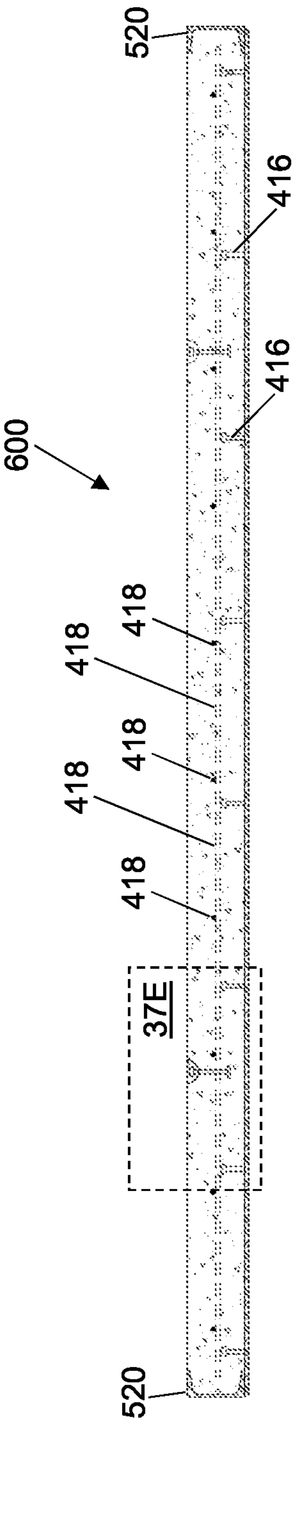
FIG. 37A is a cross-sectional view of a structural panel, according to at least one non-limiting embodiment, for use as a floor and/or roof section in a non-limiting example, the illustrated panel shown as taken along the line 37A in FIG. 37B.
Figure 37C:
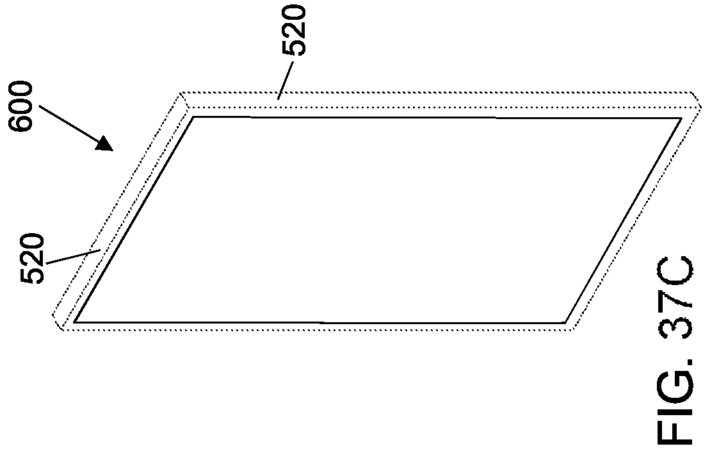
FIG. 37C is a perspective view of the structural panel of FIG. 37A.
Figure 37B:
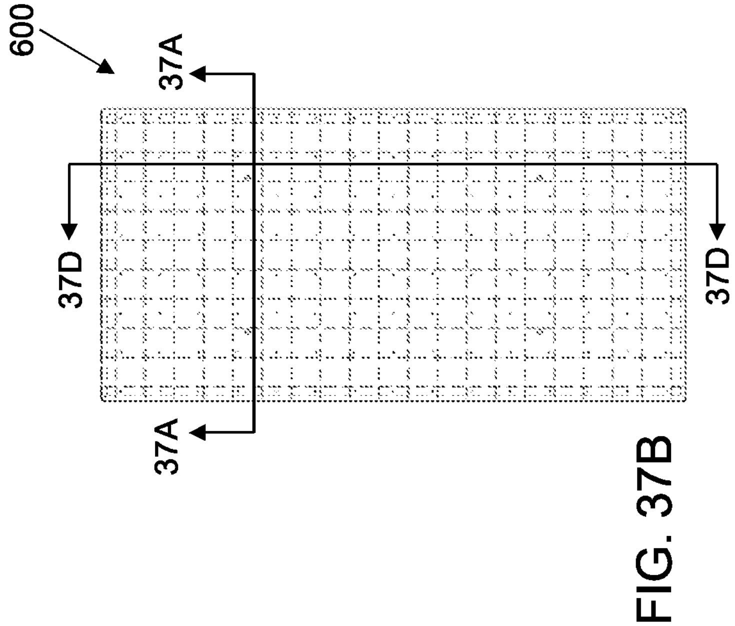
FIG. 37B is a plan view of the structural panel of FIG. 37A, with embedded components shown in dashed line.
Figure 37D:
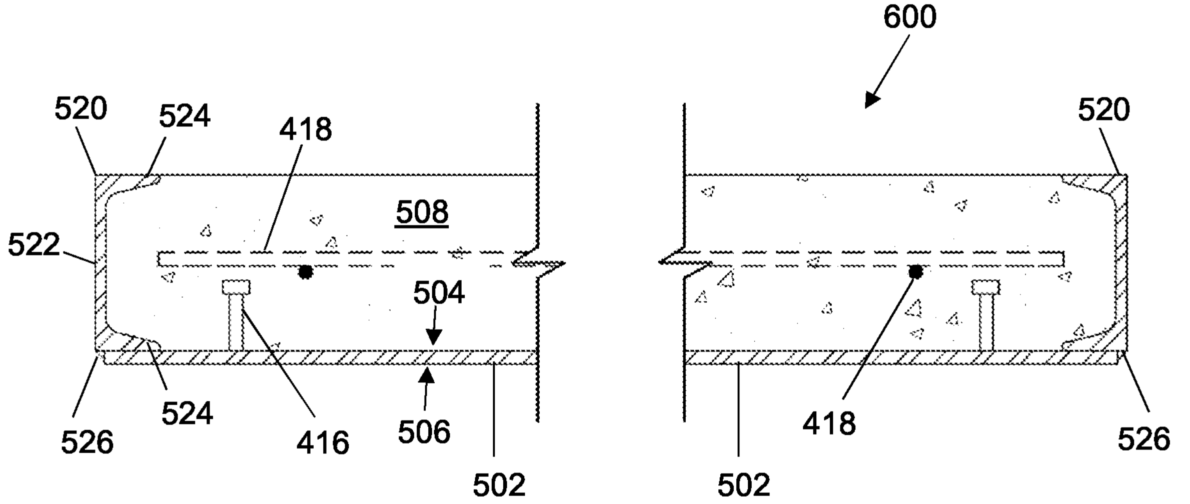
FIG. 37D is a partial cross-sectional view of the structural panel of FIG. 37A, taken along the line 37D in FIG. 37B.
Figure 37E:
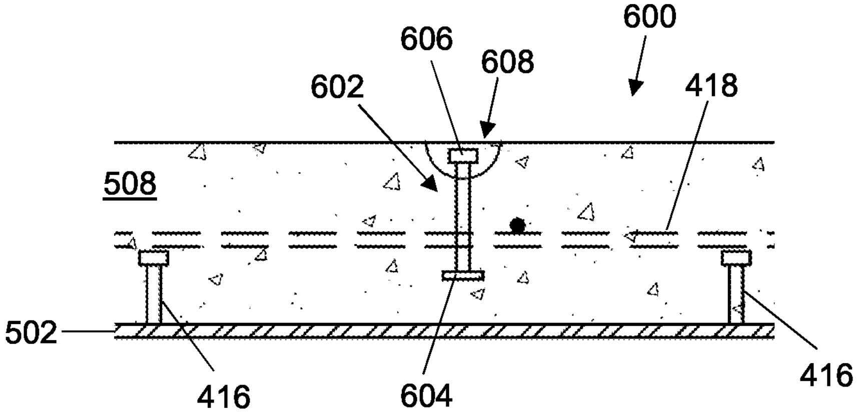
FIG. 37E is an enlarged portion of the cross-sectional view of FIG. 37A.

FIG. 37A is a cross-sectional view of a structural panel 600, constituting an EMP protective composite panel according to a non-limiting embodiment, for use as a floor and/or roof section in a non-limiting example, having a backing sheet 502 and C-channel side members 520 forming a periphery along edges of the backing sheet 502. The structural panel 600 bears similarities in form and elements to the structural panel 500, benefiting thus from immediately above-descriptions, especially where same reference numbers refer to same elements. The structural panel 600 is expressly illustrated as having lifting inserts 602, having utility as previously described at least with reference to the lifting and bracing inserts 420 in FIG. 28. The illustrated inserts 602 have embedded anchors 604 (FIG. 37E) and sunken couplers 606, such as heads, hooks, or loops to be hooked or otherwise coupled to a hoisting cable or chain.

The anchors 604 can be connected to the grid, for example by wire tying to the reinforcing members 418, for stability before the pour. The couplers 606 are sunken or flush relative to the upper outer facing surface of the cured slab of cementitious material 508 so as not to protrude from the finished structural panel 600. A cup, which may be removable, can be placed around the coupler to exclude the fill of cementitious material during the pour around the coupler to leave an access space 608 around at least the coupler 606 at the surface of the slab to permit attachment to hoisting equipment. See also tilt-up lifting inserts 420 in FIG. 28 and lifting inserts 461 in FIG. 34 for other examples and illustrations of lifting inserts.

Figure 38A:
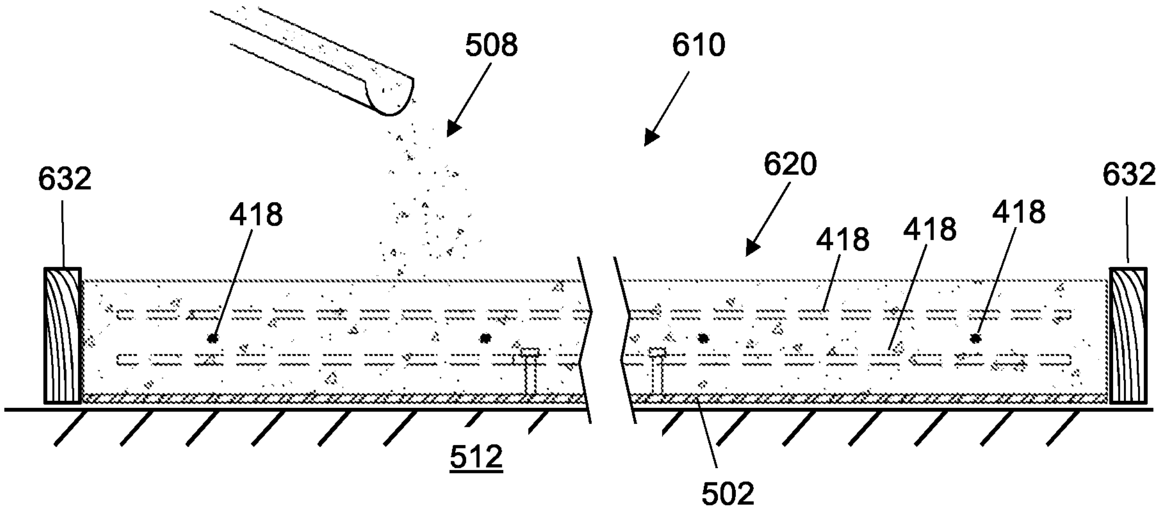
FIG. 38A is a partial cross-sectional view of a multi-functional structural panel and removable edge form, and an exemplary casting arrangement therefor, according to at least one non-limiting embodiment, the illustrated panel shown as taken along the line 38A in FIG. 38B.
Figure 38B:
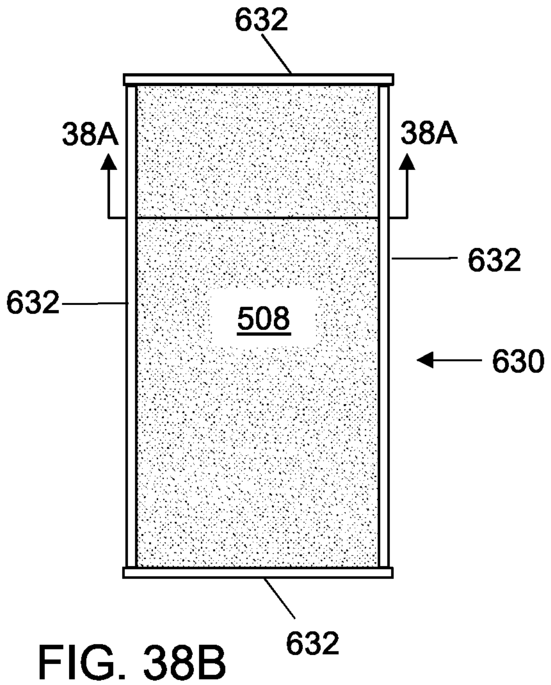
FIG. 38B is a plan view of the slab side of the structural panel and removable edge form of FIG. 38A.
Figure 38C:
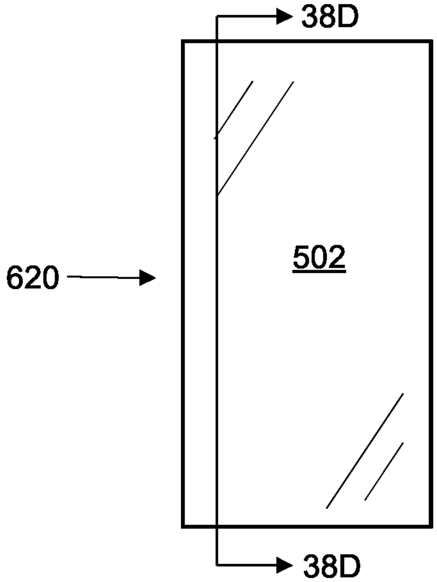
FIG. 38C is a plan view of the backing panel side of the structural panel of FIG. 38A, free of the removable edge form.

FIG. 38A is a partial cross-sectional view of a multi-functional structural panel 620, and a casting arrangement therefor. The structural panel 620 bears similarities in form and elements to the structural panels 500 and 600, benefiting thus from above-descriptions thereof, especially where same reference numbers refer to same elements. In the casting arrangement 610 of FIG. 38A, a removable edge form 630 is positioned along at least some of the edges of the ferrous backing sheet, for example around the backing sheet perimeter. Side members 632 in the casting arrangement 610 of the FIG. 38A are removable from the slab once cured. The perimeter edges of the cured slab are thus side edges of the slab in the structural panel 620. The side members 632 in the illustrated embodiment of FIGS. 38A and 38B are non-ferrous, and for example can be made of wood.

Together the backing sheet 502 and side members define a volume in the illustrated casting arrangement. The backing sheet 502 is horizontally placed on ground or other support surface 512 such as a building's floor slab on grade, with the side members 632 standing upward as walls serving together as a peripheral wall surrounding the volume that receives poured cementitious material 508. The backing sheet 502 and side members tentatively form a shallow vessel into which cementitious material is introduced by pouring as illustrated in FIG. 38A or applied by a shotcrete approach. The cementitious material can be EMP protective with the addition of carbon-based material as part of the concrete mix design, and can provide a redundancy of EMP protection above that of the backing sheet 502 and other ferrous components. The grid of reinforcing members 418 is placed into the volume before the introduction of cementitious material to be embedded in the resultant cured slab. Other elements shown embedded and/or buried in the cementitious material are described in the preceding according to same reference numbers.

In the structural panel 620, longitudinally extending edge adjacent stiffeners 530E are shown as L-channel members. The edge adjacent stiffeners 530E are similar or same in form and material as the longitudinally extending stiffeners 530 shown more central in the volume and resultant slab, and as the stiffeners 530 detailed with reference above to FIGS. 36A and 36B. The edge adjacent stiffeners 530E in FIG. 38D each have one leg serving as a base positioned along the inner facing surface or side of the backing sheet 502 to be buried in the poured cementitious material 508, and another leg that stands upward into the volume to be embedded in the cementitious material. For the edge adjacent stiffeners 530E, the standing embedded leg 532 is spaced from the respective adjacent edge of the backing panel by the dimension of the base leg, leaving the perimeter edges of the cured slab as exposed in the structural panel 620 after removal of the side members according to the casting arrangement of the FIG. 38A. The structural panel 620 accordingly has cementitious peripheral faces 620A in distinction relative to the structural panels 500 and 600, each having the C-channel side members 520 defining ferrous material peripheral edges.

Figure 38D:
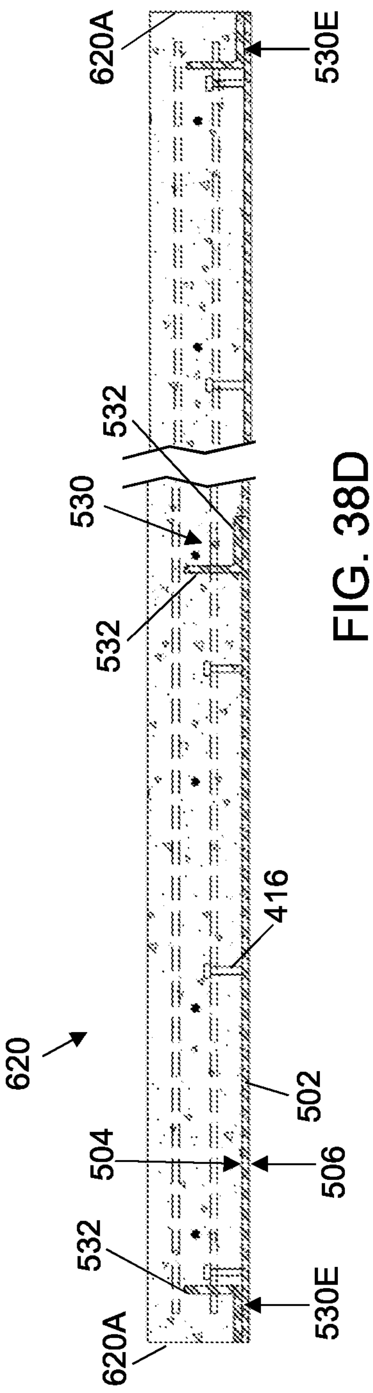
FIG. 38D is a partial cross-sectional view of the multi-functional structural panel of FIG. 38A, shown as taken along the line 38D in FIG. 38C.
Figure 38E:
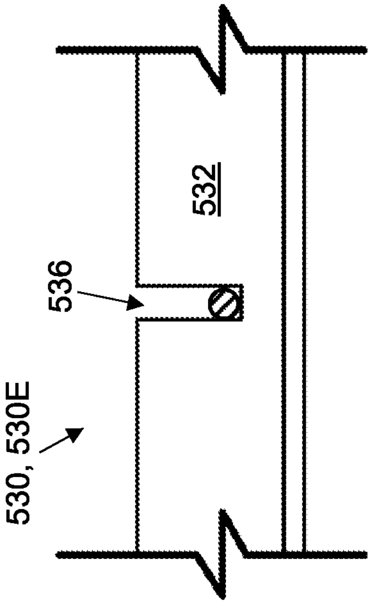
FIG. 38E is an elevation view of a section of a slotted stiffener with an inserted reinforcement member, according to at least one embodiment.

In another feature of distinction suggested in FIG. 38D and expressly illustrated in FIG. 38E, the edge adjacent stiffeners 530E and the more central stiffeners 530 have slots 536 formed in their standing legs 532 to accommodate the reinforcing members 418 of the grid. This registers and maintains, during the pour and curing, the grid at a preferred position in the volume, with reference to longitudinal, lateral, and depth placement. The stiffeners provide additional rigidity to the backing panel, an advantage particularly beneficial in the illustrated embodiment of FIGS. 38A-38E, which is fabricated without the C-channel side members 520 for example in the embodiment of FIG. 36A.

Particular embodiments and features have been described with reference to the drawings. It is to be understood that these descriptions are not limited to any single embodiment or any particular set of features, and that similar embodiments and features may arise or modifications and additions may be made without departing from the scope of these descriptions and the spirit of the appended claims.

What is claimed is:

1. A method comprising fabricating each of multiple structural panels and constructing an EMP-protective composite structure using the multiple structural panels, wherein fabricating each of the multiple structural panels comprises:

placing a steel sheet in a horizontal position, such that an inner side of the steel sheet to which multiple studs are welded is upward facing;

positioning a removable edge form of side members around the steel sheet defining a perimeter above the inner side of the steel sheet;

placing a grid within the perimeter, the grid comprising a plurality of elongate and mutually interlocked reinforcing members;

pouring a cementitious layer onto the inner side of the steel sheet thereby embedding the multiple studs and reinforcing members; and after the cementitious layer has cured, removing the removable edge form of side members from around the steel sheet, and wherein constructing an EMP-protective composite structure using the multiple structural panels comprises:

positioning the multiple structural panels to form an enclosure such that at least one structural panel of the multiple structural panels defines a floor of the enclosure, at least one structural panel of the multiple structural panels defines a roof of the enclosure above the floor, and at least three structural panels of the multiple structural panels together define walls of the enclosure between the floor and roof; and connecting each steel sheet of each structural panel of the enclosure to each steel sheet of each structural panel adjacent thereto by at least one continuous weld.

2. The method of claim 1, wherein the side members are non-ferrous.

3. The method of claim 1, wherein the side members comprise wood.

4. The method of claim 1, further comprising elongate stiffeners extending along the inner side of the steel sheet.

5. The method of claim 4, wherein the elongate stiffeners are affixed to the inner side of the steel sheet.

6. The method of claim 5, wherein the elongate stiffeners comprise at least one of an L-channel member and a C-channel member.

7. The method of claim 1, further comprising connecting tilt-up lifting inserts to the grid before pouring the cementitious layer.

8. The method of claim 1, wherein connecting each steel sheet of each structural panel of the enclosure to each steel sheet of each structural panel adjacent thereto by at least one continuous weld comprises:

connecting an expansion joint to the steel sheet of a first structural panel by a first continuous weld; and connecting the expansion joint to the steel sheet of a second structural panel adjacent to the first structural panel by a second continuous weld.

9. The method of claim 8, wherein positioning the multiple structural panels to form an enclosure comprises positioning the first structural panel adjacent to the second structural panel each as vertical.

10. The method of claim 8, wherein positioning the multiple structural panels to form an enclosure comprises positioning the first structural panel adjacent to the second structural panel apart by a space.

11. The method of claim 10, further comprising positioning the expansion joint as covering the space.

12. The method of claim 10, wherein connecting the expansion joint to the steel sheet of the second structural panel by the second continuous weld comprises closing the space.

13. The method of claim 8, wherein the expansion joint extends along a length of at least the first structural panel.

* * * * *